(12) United States Patent
Dykaar

(10) Patent No.: US 11,515,684 B2
(45) Date of Patent: Nov. 29, 2022

(54) DEVICES TO GENERATE LIGHT

(71) Applicant: GOOGLE LLC, Mountain View, CA (US)

(72) Inventor: Douglas Raymond Dykaar, Waterloo (CA)

(73) Assignee: GOOGLE LLC, Mountain View, CA (US)

( * ) Notice: Subject to any disclaimer, the term of this patent is extended or adjusted under 35 U.S.C. 154(b) by 64 days.

(21) Appl. No.: 16/796,141

(22) Filed: Feb. 20, 2020

(65) Prior Publication Data

US 2020/0274326 A1   Aug. 27, 2020

Related U.S. Application Data

(60) Provisional application No. 62/808,655, filed on Feb. 21, 2019.

(51) Int. Cl.
  *H01S 5/34*   (2006.01)
  *H01S 5/10*   (2021.01)
  (Continued)

(52) U.S. Cl.
  CPC .......... *H01S 5/1028* (2013.01); *H01S 5/028* (2013.01); *H01S 5/1032* (2013.01); *H01S 5/125* (2013.01); *H01S 5/142* (2013.01); *H01S 5/3412* (2013.01); *H01S 5/4068* (2013.01); *H01S 5/1071* (2013.01); *H01S 5/2027* (2013.01); *H01S 5/4087* (2013.01)

(58) Field of Classification Search
  None
  See application file for complete search history.

(56) References Cited

U.S. PATENT DOCUMENTS 8,357,926 B2 * 1/2013 Wang .................. H01L 31/1025
  257/14
8,615,025 B2 * 12/2013 Dallesasse .............. H01S 5/021
  372/20

(Continued)

FOREIGN PATENT DOCUMENTS

EP      1804350 A1 *  7/2007  ............. H01S 5/341

OTHER PUBLICATIONS

Campenhout et al. ("Electrically pumped InP-based microdisk lasers integrated with a nanophotonic silicon on insulator waveguide circuit", Optics express, 15 (11), 2007) (Year: 2007).*

(Continued)

*Primary Examiner* — Tod T Van Roy

(57) ABSTRACT

There is provided a device to generate an output light. The device comprises a substrate, a quantum well structure (QWS) disposed on the substrate, and a waveguide disposed on the substrate and in contact with the QWS. The QWS has a first layer, a second layer, and a third layer. The second layer is disposed and quantum-confined between the first layer and the third layer. In addition, the second layer is to emit an input light when electrically biased. The input light has an optical field extending outside the QWS and into the waveguide, to optically couple the waveguide with the QWS. The waveguide is to provide an optical resonance cavity for the input light. Moreover, the waveguide has an optical outlet to transmit at least some of the input light out of the waveguide to generate the output light.

19 Claims, 21 Drawing Sheets

(51) Int. Cl.
   *H01S 5/40* (2006.01)
   *H01S 5/125* (2006.01)
   *H01S 5/028* (2006.01)
   *H01S 5/14* (2006.01)
   *H01S 5/20* (2006.01)

(56) References Cited

U.S. PATENT DOCUMENTS

| | | | | |
|---|---|---|---|---|
| 8,885,675 | B2* | 11/2014 | Yamazaki | H01S 5/0687 |
| | | | | 372/50.1 |
| 9,318,868 | B2* | 4/2016 | Creazzo | H01S 3/10053 |
| 9,509,122 | B1* | 11/2016 | Norberg | H01L 31/0328 |
| 10,305,250 | B2* | 5/2019 | Bhattacharya | H01S 5/1042 |
| 10,374,394 | B2* | 8/2019 | Mayer | H01S 5/0092 |
| 10,826,272 | B2* | 11/2020 | Bovington | G02F 1/2257 |
| 11,152,760 | B2* | 10/2021 | Brandt | H01S 5/06255 |
| 11,298,057 | B2* | 4/2022 | Vizbaras | G01J 3/42 |
| 2004/0109485 | A1* | 6/2004 | Flory | H01S 5/187 |
| | | | | 372/45.01 |
| 2011/0163292 | A1* | 7/2011 | Wang | B82Y 20/00 |
| | | | | 257/13 |
| 2017/0207600 | A1* | 7/2017 | Klamkin | H01S 5/142 |
| 2020/0091682 | A1* | 3/2020 | Giuntoni | H01S 5/343 |

OTHER PUBLICATIONS

Kim et al. ("Monolithically integrated InGaAs nanowires on 3d structured SOI as a new platform for full optical links", Nano letters, 16, 2016) (Year: 2016).*

Lee et al. ("Nanopillar array band-edge laser cavities on SOI for monolithic integrated light sources", Applied physics letters, 108, 2016) (Year: 2016).*

* cited by examiner

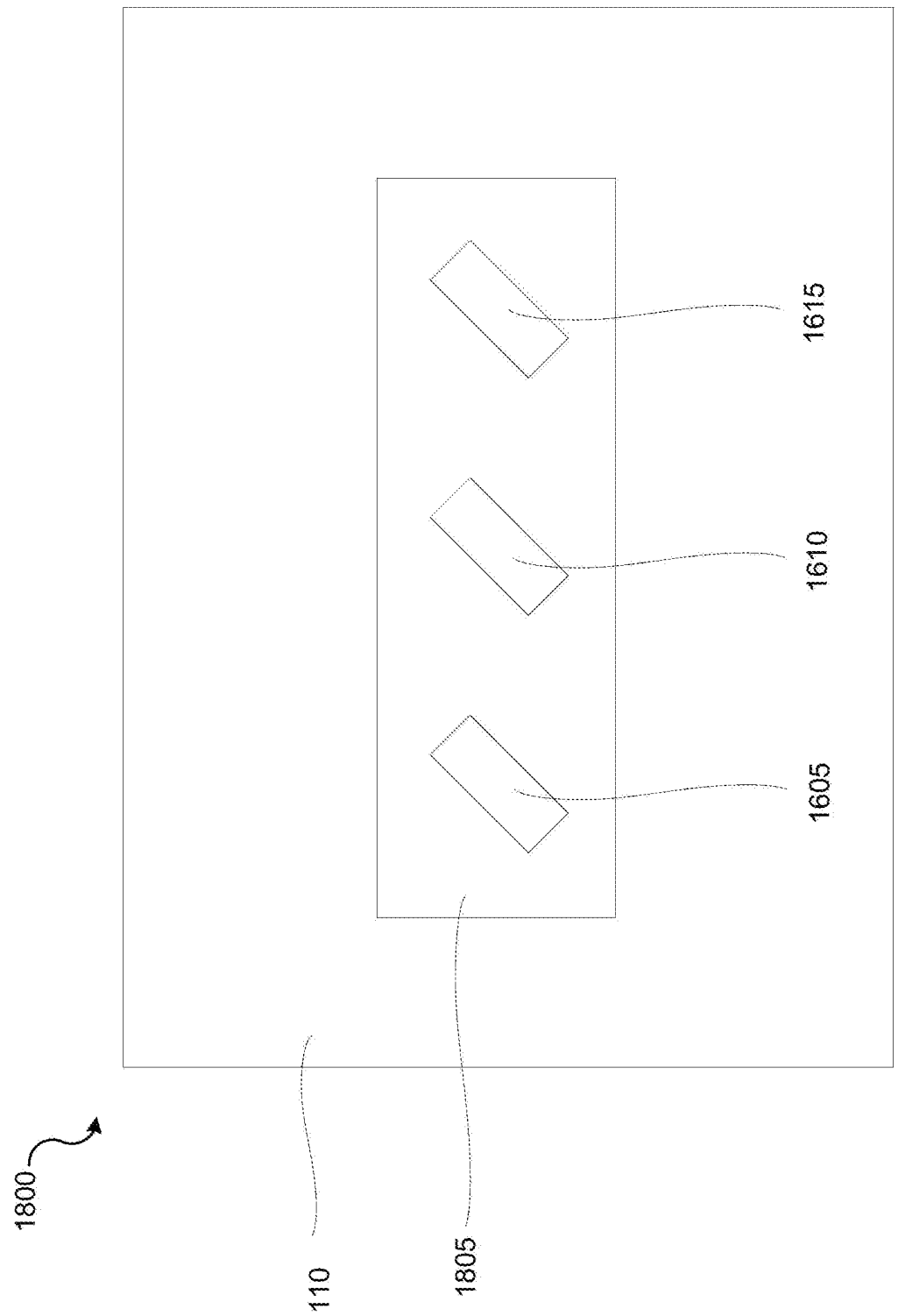

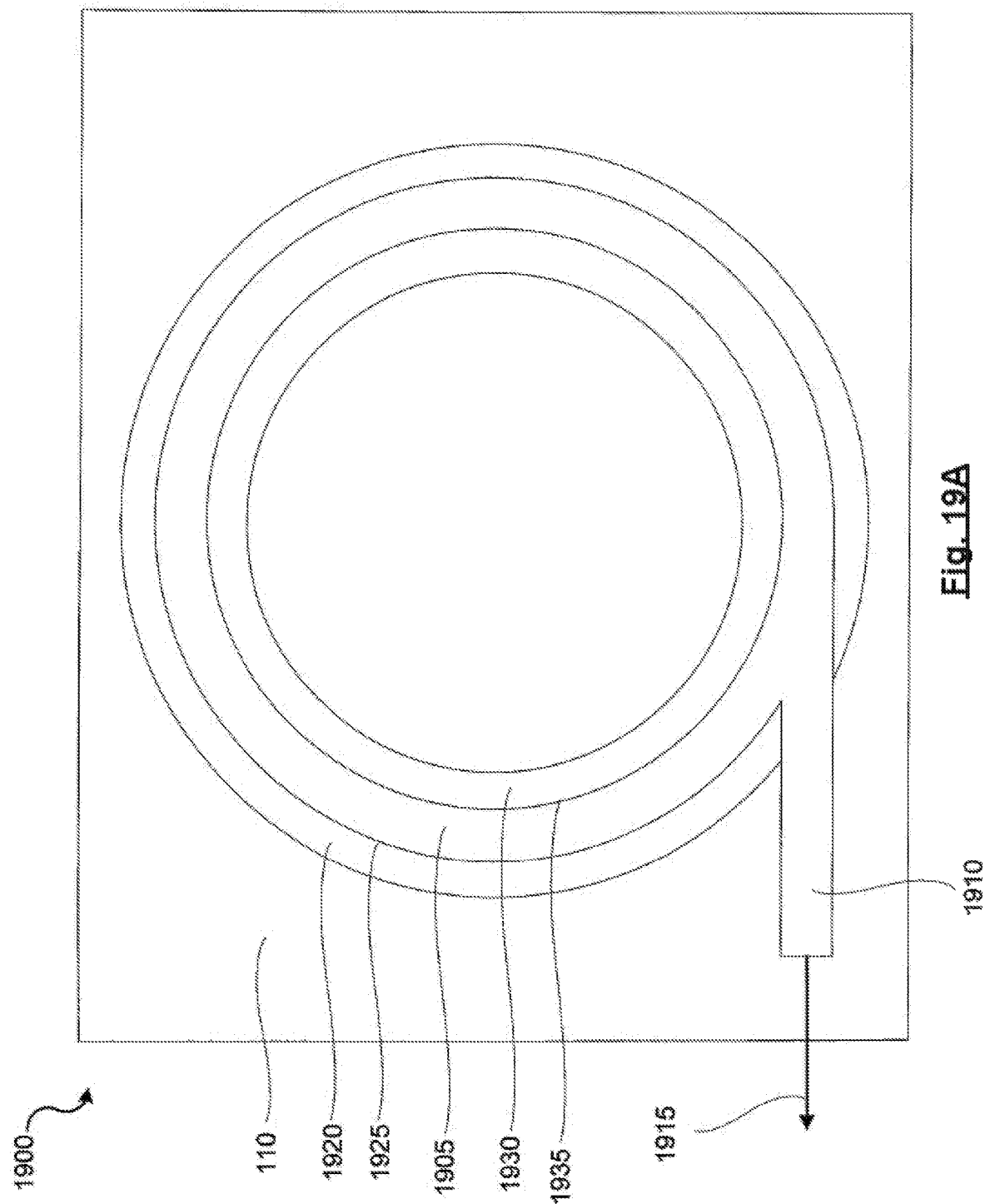

DEVICES TO GENERATE LIGHT

CROSS REFERENCE TO RELATED APPLICATIONS

This application claims the benefit of U.S. Provisional Application No. 62/808,655, filed Feb. 21, 2019, titled "Devices to Generate Light", the content of which is incorporated herein in its entirety by reference.

FIELD

The present specification relates to devices to generate light, and in particular to devices to generate laser light.

BACKGROUND

Electric light sources may be used to generate light. Different types of electric light sources use different underlying physical processes to convert electrical power into light. Laser light sources are one of the types of electric light sources. Laser light sources may be used in a variety of applications including image projection.

SUMMARY

According to an implementation of the present specification there is provided a device to generate an output light. The device comprises: a substrate; a quantum well structure (QWS) disposed on the substrate, the QWS having a first layer, a second layer, and a third layer, the second layer disposed and quantum-confined between the first layer and the third layer, the second layer to emit an input light when electrically biased, the input light having an optical field extending outside the QWS; and a waveguide disposed on the substrate and in contact with the QWS, the optical field extending into the waveguide to optically couple the waveguide with the QWS, the waveguide to provide an optical resonance cavity for the input light, the waveguide having an optical outlet to transmit at least some of the input light out of the waveguide to generate the output light.

The substrate may comprise a first side and a second side opposite the first side; the QWS and the waveguide may be disposed on the first side and extend from the first side in a first direction away from the second side; and the waveguide may be in contact with the QWS in a second direction lateral to the first direction.

The QWS may abut the waveguide in the second direction.

The QWS may be partially disposed in the waveguide.

A footprint of the QWS on the substrate may be positioned in a corresponding footprint of the waveguide on the substrate.

The waveguide may be dimensioned to contain the optical field.

The QWS may comprise a nanorod having an axial dimension along the first direction; and the nanorod may contact the waveguide in the second direction being radial to the axial dimension of the nanorod.

A footprint of the nanorod on the substrate may have a longest dimension not exceeding about 5 µm, 2 µm, or 1 µm.

The first layer, the second layer, and the third layer may be stacked along the axial dimension.

The nanorod may comprise a core, an inner shell, and an outer shell oriented along the axial dimension, the core comprising the first layer, the inner shell comprising the second layer, and the outer shell comprising the third layer.

The device may further comprise: one or more additional QWSs disposed on the substrate and in contact with the waveguide, each of the additional QWSs having a corresponding first layer, a corresponding second layer, and a corresponding third layer, the corresponding second layer disposed and quantum-confined between the corresponding first layer and the corresponding third layer, the corresponding second layer to emit a corresponding input light when electrically biased, the corresponding input light having a corresponding optical field extending outside the respective additional QWS.

Each of the additional QWSs may comprise a corresponding nanorod having a corresponding axial dimension along about the first direction; and each of the corresponding nanorods may contact the waveguide in a corresponding second direction being radial to the corresponding axial dimension of the corresponding nanorod.

The input light and the corresponding input light may have a given wavelength.

The QWS may comprise a nanowall having a height dimension along the first direction.

The nanowall may have an elongated footprint on the substrate, the elongated footprint having a longitudinal dimension and a lateral dimension lateral to the longitudinal dimension, the lateral dimension not exceeding about 5 µm, 2 µm, or 1 µm.

The first layer, the second layer, and the third layer may be stacked along the height dimension.

The nanowall may have an elongated footprint on the substrate, the elongated footprint having a longitudinal dimension and a lateral dimension lateral to the longitudinal dimension; the waveguide may comprise an elongated member having a corresponding longitudinal dimension; and the longitudinal dimension of the nanowall may be oriented about parallel to the longitudinal dimension of the waveguide.

The waveguide may comprise a core to transmit the input light and a cladding to cover at least a portion of the core, the cladding disposed between the QWS and the core.

The device may further comprise a reflective layer disposed on the substrate between the substrate and the waveguide.

The device may further comprise an anti-reflective layer disposed on the QWS between the QWS and the waveguide.

The waveguide may be about ring-shaped.

The QWS may be in contact with a first segment of the waveguide disposed between a first reflector and a second reflector, and the input light may have a first wavelength; and the first reflector may be to reflect the first wavelength and the second reflector may be to partially reflect and partially transmit the first wavelength. The device may further comprise: a second QWS disposed on the substrate and in contact with a second segment of the waveguide disposed between the second reflector and a third reflector, the second QWS to emit a corresponding input light having a second wavelength; and the second reflector may be to reflect the second wavelength and the third reflector may be to transmit the first wavelength and partially reflect and partially transmit the second wavelength. The device may also further comprise: a third QWS disposed on the substrate and in contact with a third segment of the waveguide disposed between the third reflector and a fourth reflector, the third QWS to emit a corresponding input light having a third wavelength; and the third reflector may be to transmit the first wavelength and the second wavelength and to reflect the third wavelength and the fourth reflector may be to transmit the first wavelength and the second wavelength and to partially reflect and partially transmit the third wavelength.

One or more of the first reflector, the second reflector, the third reflector, and the fourth reflector may comprise a Bragg reflector disposed in the waveguide.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

FIG. 18 shows a schematic top plan view of yet another example device to generate an output light, in accordance with a non-limiting implementation of the present specification.

FIG. 19A shows a schematic top plan view of yet another example device to generate an output light, in accordance with a non-limiting implementation of the present specification.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, and the like. In other instances, well-known structures associated with light sources have not been shown or described in detail to avoid unnecessarily obscuring descriptions of the implementations.

Unless the context requires otherwise, throughout the specification and claims which follow, the word "comprise" and variations thereof, such as, "comprises" and "comprising" are to be construed in an open, inclusive sense, that is as "including, but not limited to."

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the implementations.

Laser light sources may be used in applications at various size scales ranging from image projection on large screens to relatively small-scale applications such as wearable or mobile devices where lasers may be used in near-eye image projection. In small-scale applications, lasers may be fabricated separately, and then positioned in a projection system or on a printed circuit board (PCB). Manipulation or positioning of a separately-fabricated laser may pose alignment and integration challenges.

Figure 1:
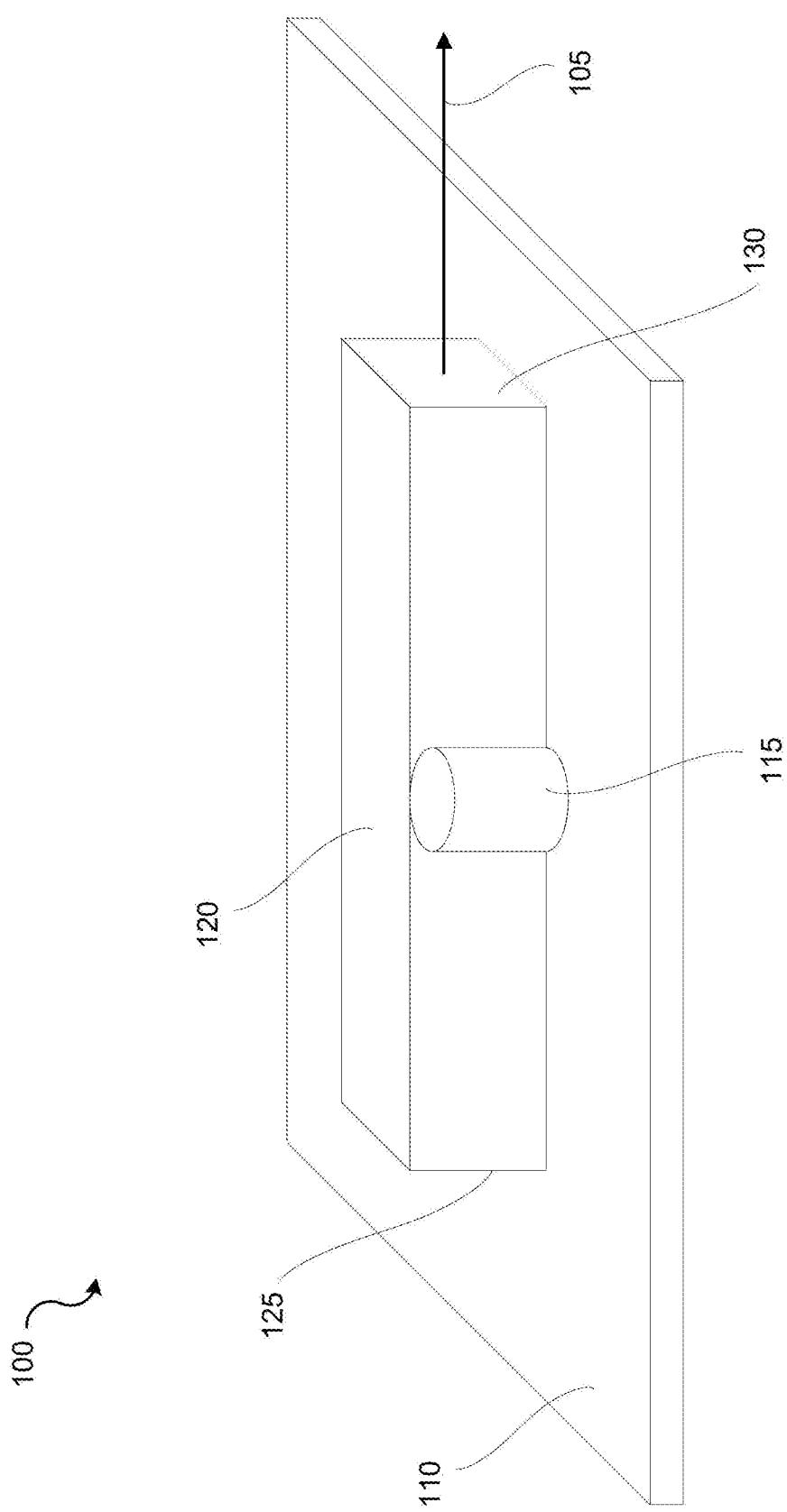
FIG. 1 shows a schematic top perspective view of an example device to generate an output light, in accordance with a non-limiting implementation of the present specification.

To address some of the alignment and integration challenges, lasers may be fabricated on-chip using lithography or other electronics fabrication techniques. FIG. 1 shows a schematic top perspective representation of an example device 100 to generate an output light 105. In some examples, output light 105 may comprise laser light. Device 100 comprises a substrate 110, a nanorod 115 disposed on substrate 110, and a waveguide 120 disposed on substrate 110 and in contact with nanorod 115.

Nanorod 115 may be electrically biased to emit light, which light may have an optical field extending outside nanorod 115 and into waveguide 120 to optically couple waveguide 120 with nanorod 115. This optical coupling may allow the light generated by nanorod 115 to enter into waveguide 120. As such, the light generated by nanorod 115 may be referred to as the input light for waveguide 120.

Waveguide 120 may in turn provide an optical resonance cavity for the input light. For example, a first end 125 of waveguide 120 may reflect the input light and the second end 130 of waveguide 120 may partially reflect the input light and partially transmit the input light to generate output light 105. In this manner, end 130 may act as an optical outlet of waveguide 120. The sides of waveguide 120 other than the ends 125 and 130 may reflect the input light using total internal reflection, or with the aid of reflective coatings or layers on the sides of waveguide 120.

As the input light is reflected back and forth, i.e. resonates, inside waveguide 120, some of the optical field of the resonating light may extend out of waveguide 120 and into nanorod 115. This resonating light may in turn stimulate nanorod 115 to emit further input light, which further input light may be optically coupled with and resonate inside waveguide 120. In this manner, device 100 may act as a laser, with nanorod 115 acting as the gain medium and waveguide 120 acting as the optical resonance cavity.

While the sides of waveguide 120 other than second end 130 may generally confine the input light inside waveguide 120, some of the optical field of the input light inside waveguide 120 may extend beyond the sides of waveguide 120 to allow the input light inside waveguide 120 to be optically coupled with nanorod 115 and to stimulate emission of further input light by nanorod 115. Some examples of the optical field of the input light inside waveguide 120 extending beyond the sides of waveguide 120 may include the fringing fields extending out of waveguide 120, the evanescent field extending out of waveguide 120 (e.g. Goos-Hänchen effect), and the like. In other examples, which are described in greater detail below, the nanorod may be disposed at least partially inside the waveguide. In such examples the input light resonating inside the waveguide may directly impinge upon the nanorod to stimulate the emission of further input light by the nanorod.

In alternative implementations, waveguide 120 may act as an optical directing element for the input light instead of an optical resonance cavity. For example, first end 125 of waveguide 120 may reflect the input light and the second end 130 of waveguide 120 may not reflect the input light and instead transmit the input light to generate output light 105. In this manner, end 130 may act as an optical outlet of waveguide 120. The sides of waveguide 120 other than the ends 125 and 130 may reflect the input light using total internal reflection, or with the aid of reflective coatings or layers on the sides of waveguide 120. Consequently, the input light may be redirected to be output only from end 130 without causing significant stimulated emission of nanorod 115, since the input light will experience little to no reflecting back and forth within waveguide 120. In this way, device 100 can act as a super-luminescent diode (SLD or SLED).

Nanorod 115 may form or comprise a quantum well, in which case nanorod 115 may be described as a being or comprising a quantum well structure (QWS). A quantum well may comprise a potential well in which a quantity of material, for example a layer of material, is quantum confined. In some examples such a quantum well may be fabricated by sandwiching an inner layer of a semiconductor material having a smaller bandgap between two outer layers of materials with relatively larger bandgaps.

The inner layer may experience quantum confinement in at least one dimension if the space between the outer layers which the inner layer occupies approaches the de Broglie wavelength of the wave function of the carriers, such as electrons, of the inner layer. Such quantum confinement may cause the energy levels in the inner layer to become quantized, and the bandgap between the conduction and valence bands to become dependent on the extent of the confinement. The extent of the confinement, in turn, may be determined by the physical dimension of the space between the outer layers, which space the inner layer occupies.

In such a QWS, electrically biasing the inner quantum-confined layer may cause the inner layer to emit light. Applying the electrical bias may excite some of the electrons across the bandgap from the valence band to the conduction band. When these excited electrons relax back into the valence band, they may emit their energy as a photon. The energy, and therefore the wavelength, of the photon may be commensurate with the bandgap of the material. By tailoring the size of the space between the outer layers which the inner layer occupies, and thereby adjusting the extent of quantum confinement, the size of the bandgap and thereby the wavelength or color of the emitted light may be adjusted.

In addition, multiple quantum wells could be implemented in a single QWS. This could be achieved by including multiple quantum-confined layers in a single QWS, each quantum-confined layer being a semiconductor material having a smaller bandgap, sandwiched between two quantum-confining layers of materials with relatively larger bandgaps. As an example, a QWS could comprise a plurality of quantum-confined layers, and a plurality of quantum-confining layers, formed as a stack of alternating quantum-confined layers and quantum-confining layers, with a quantum-confining layer on each end of the stack.

Any of the nanorods discussed herein could include multiple quantum wells in a single QWS. Further, other QWS implementations, such as nanowalls or concentric core-shell structures, could also include multiple quantum wells in a single QWS. By providing multiple quantum wells within a single QWS, optical gain of the QWS can be increased.

The layered QWSs described above may generally provide quantum confinement along one dimension, namely along the dimension that measures the space between the outer layers, which space the inner layer occupies. By adjusting the dimensions of the QWS, it is also possible to extend quantum confinement to two or three dimensions. For example, if the QWS is designed as a set of layers stacked axially along a nanorod, adjusting the diameter of the nanorod may produce further quantum-confinement effects, which in turn may affect the wavelength or color of the light emitted by the nanorod.

Figure 2:
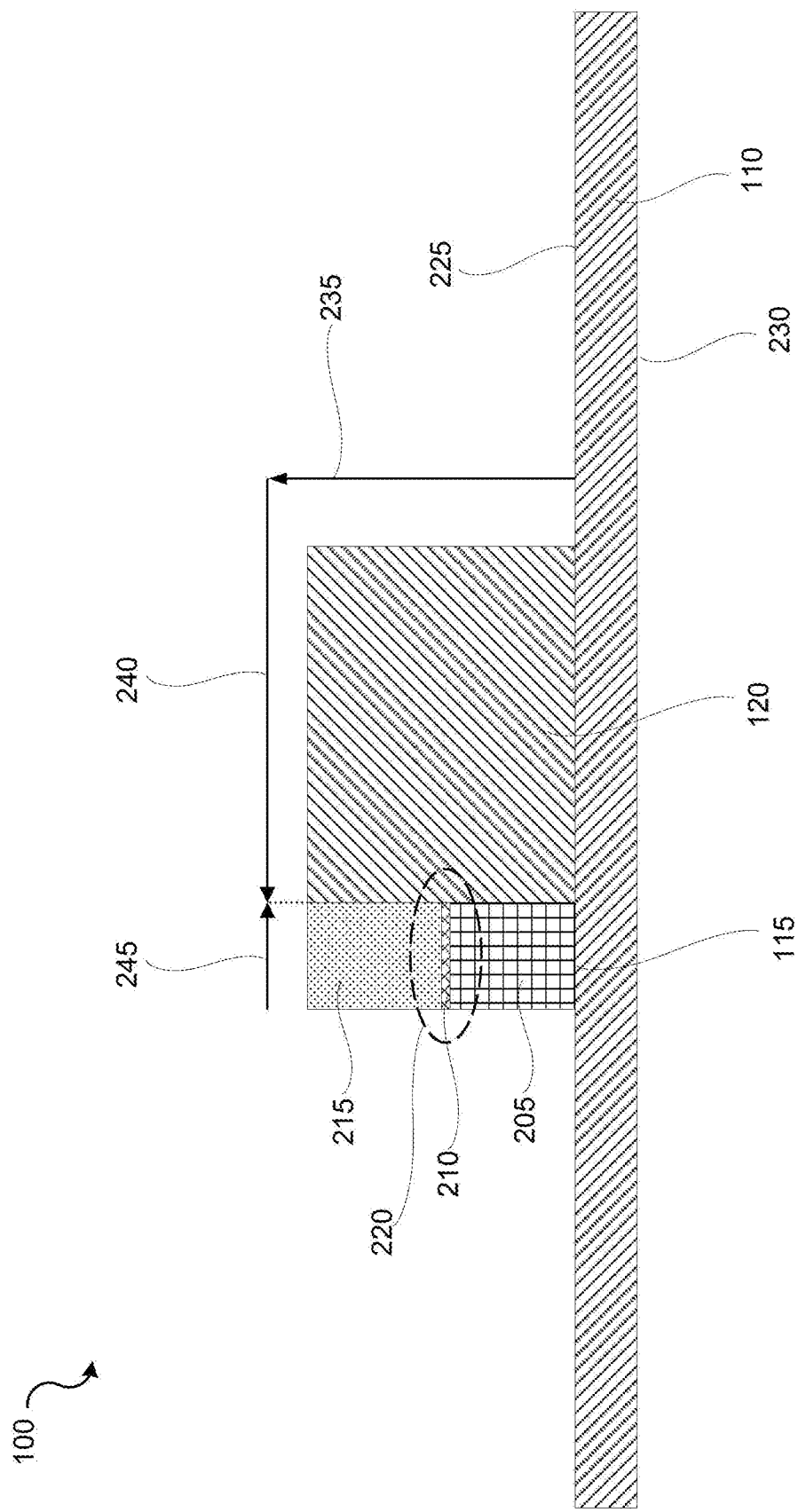
FIG. 2 shows a front elevation cross-sectional view of the device of FIG. 1.

FIG. 2 shows a front elevation cross-sectional view of device 100. FIG. 2 shows that nanorod 115 comprises a first layer 205, a second layer 210, and a third layer 215, with second layer 210 being disposed and quantum-confined between first layer 205 and third layer 215. When electrically biased, layer 210 may emit an input light. This input light may in turn have an optical field 220 which is shown schematically in FIG. 2. Optical field 220 may extend outside of nanorod 115 and extend into waveguide 120 to optically couple nanorod 115 with waveguide 120.

While FIG. 2 shows optical field 220 as extending out of nanorod 115 about equally on both sides of nanorod 115, it is contemplated that in some examples optical field 220 may be skewed towards waveguide 120 as a result of the optical coupling between nanorod 115 and waveguide 120. Examples of this skewing may include more of the energy or strength of optical field 220 being present on the side of nanorod 115 proximal waveguide 120 compared to the side of nanorod 115 that is distal from waveguide 120.

Moreover, as optical field 220 may extend some distance outside of nanorod 115, it may be possible to optically couple nanorod 115 with waveguide 120 even if the two are physically spaced from one another. As the strength of optical field 220 diminishes with distance away from nanorod 115, the larger the space and distance between the nanorod the waveguide, the weaker will be the optical field that extends into the waveguide, and consequently the weaker will be the strength of the optical coupling between the nanorod and the waveguide. In some examples, the strength of optical field 220 may drop as a function of the inverse of the distance squared. This steep drop in the strength of optical field 220 with distance may limit the maximum distance between the nanorod and the waveguide that would still allow for sufficient optical coupling between the nanorod and the waveguide.

In device 100 nanorod 115 is in contact with and abuts waveguide 120 to avoid losses in the strength of optical field 220 and the optical coupling between nanorod 115 and waveguide 120 due to spaces or gaps between the two. Moreover, in device 100 substrate 110 comprises a first side 225 and a second side 230 opposite first side 225. Nanorod 115 and waveguide 120 are disposed on first side 225 and extend from first side 225 along a first direction 235 away from second side 230. While FIG. 2 shows first direction 235 as being perpendicular to substrate 110, it is contemplated that the first direction need not be perpendicular to first side 225 of the substrate, and may comprise a direction that extends from first side 225 and generally away from second side 230.

Nanorod 115 and waveguide 120 contact one another in a direction lateral to first direction 235. This lateral direction may be referred to as a second direction. Examples of such a lateral second direction include directions 240 and 245 shown in FIG. 2. The meeting of the tips of the arrows indicating directions 240 and 245 in FIG. 2 is intended to illustrate the contact between nanorod 115 and waveguide 120, and the direction of this contact. Nanorod 115 may also be described as abutting waveguide 120 in the second direction. In other words, nanorod 115 and waveguide 120 are disposed side-by-side on first side 225 of substrate 110, and contact one another side-on. Moreover, in some examples, the second direction in which the nanorod and the waveguide contact one another may comprise other directions in the plane defined by first side 225, which other directions may be different than directions 240 and 245.

Moreover, FIG. 2 shows nanorod 115 as comprising three layers. It is contemplated that in some examples the nanorod may comprise additional layers. Furthermore, in some examples the nanorod may comprise more than one quantum-confined layer, and each of the quantum-confined layers may emit light when electrically biased. In addition, it is contemplated that nanorod 115 may comprise electrical contacts for connecting to a source of electrical power external to nanorod 115. For example, such electrical contacts may be added to one or more of the axial ends of the nanorods. For simplicity and ease of illustration, these electrical contacts are omitted from the drawings.

Figure 11:
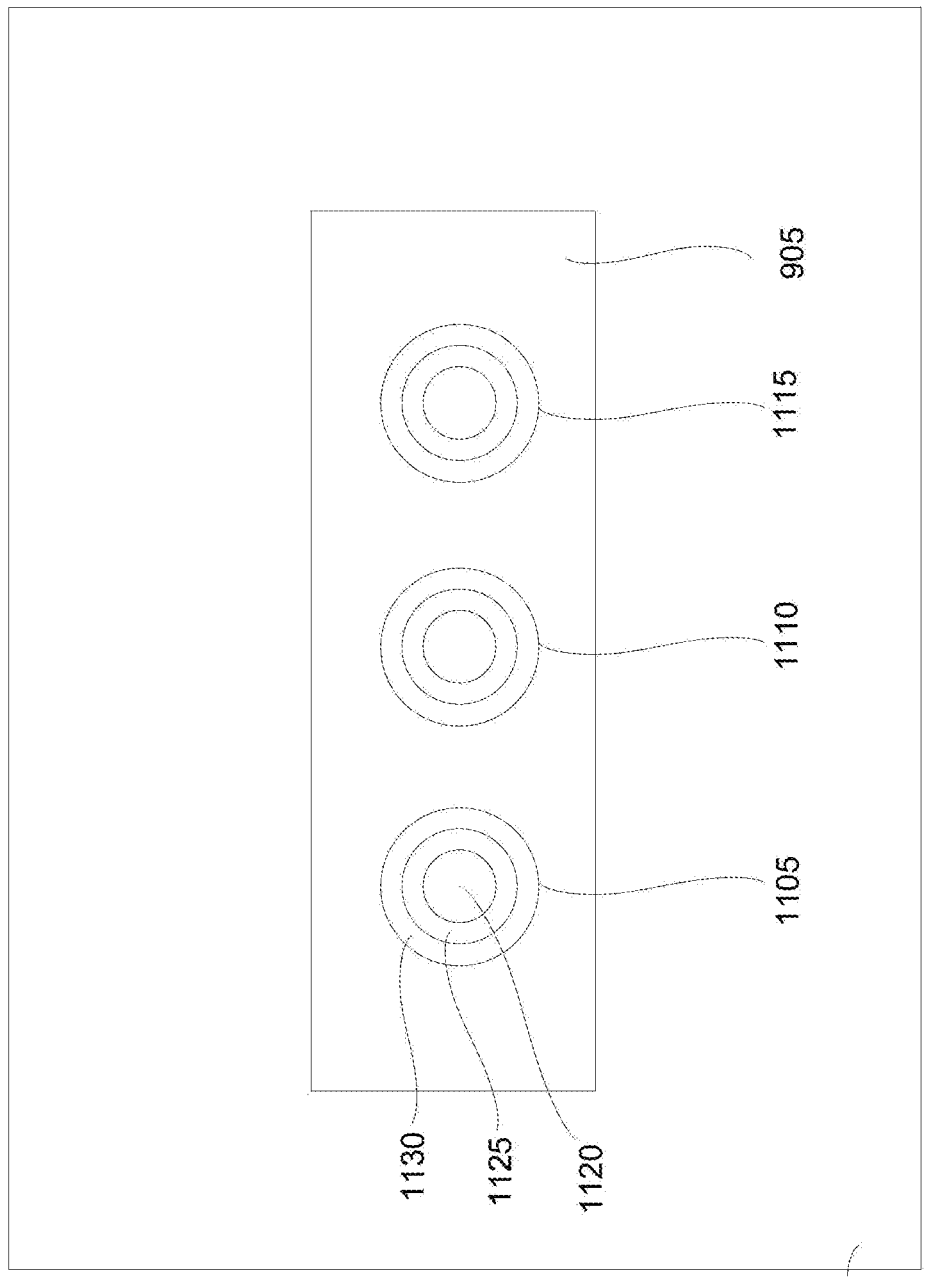
FIG. 11 shows a schematic top plan view of yet another example device to generate an output light, in accordance with a non-limiting implementation of the present specification.

In addition, FIG. 2 shows nanorod 115 having its axial dimension along first direction 235. In this orientation, nanorod 115 contacts waveguide 120 in a second direction that is radial to the axial dimension of nanorod 115. Moreover, as shown in FIG. 2, first layer 205, second layer 210, and third layer 215 are stacked along the axial dimension of nanorod 115. This type of axially layered or segmented nanorod may also be described as a super-lattice type nanorod. It is contemplated that in other examples, the first, second, and third layers may be stacked or oriented differently, and need not be stacked along the axial dimension. For example, the nanorod may comprise a core-shell-shell structure whereby the first, second, and third layers form a core, an inner shell, and an outer shell oriented along the axial dimension of the nanorod. Such core-shell-shell nanorods are shown in FIG. 11, and will be further described below.

Figure 3:
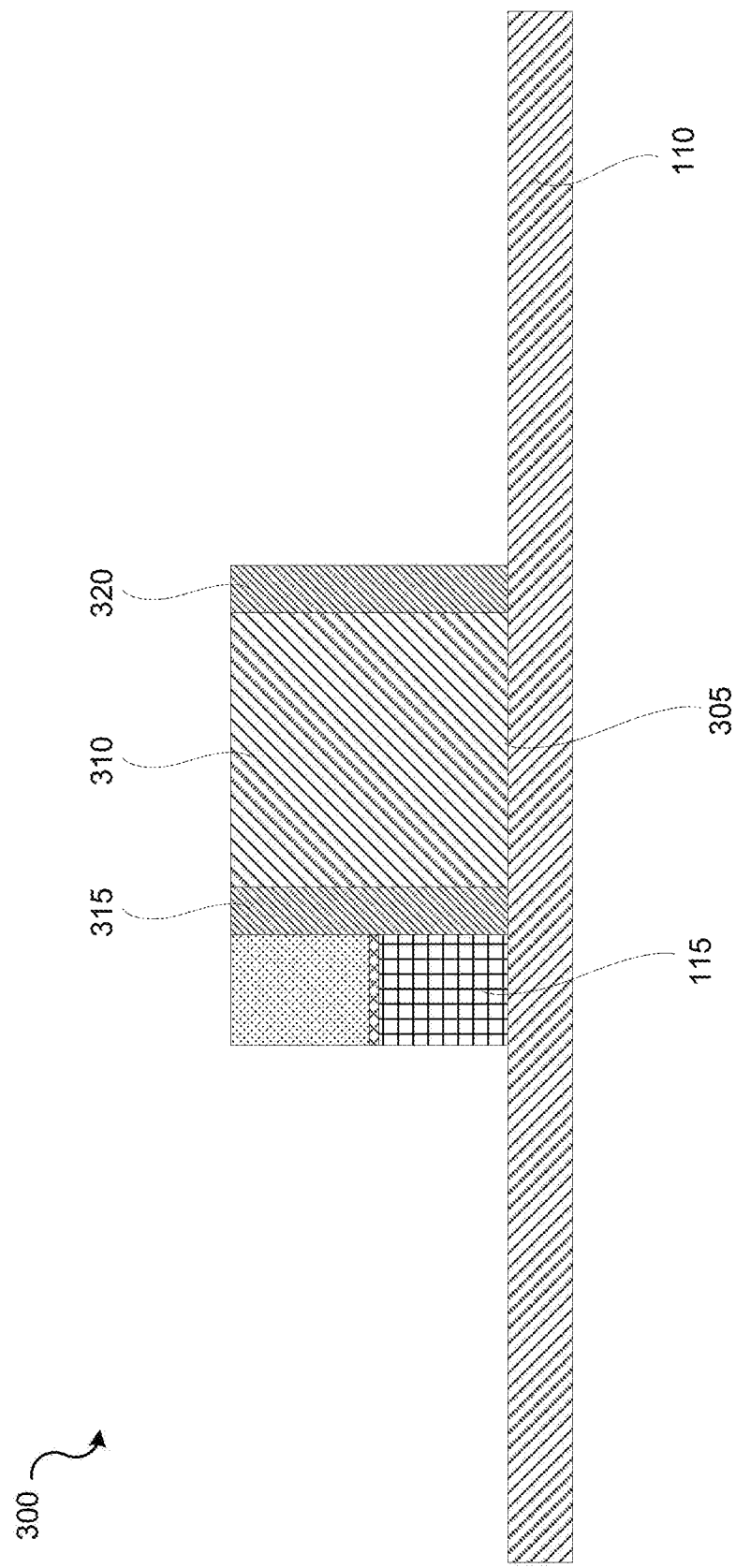
FIG. 3 shows a front elevation cross-sectional view of another example device, in accordance with a non-limiting implementation of the present specification.

Turning now to FIG. 3, a schematic front elevation cross-sectional view of an example device 300 is shown. Device 300 has a similar structure and function as device 100. One difference between device 300 and device 100 is that in device 300 waveguide 305 comprises a core 310 to transmit the input light and cladding layers 315 and 320 to cover two of the sides of core 310. In some examples, cladding layers may also cover one or both of the top side of the core that is distal from substrate 110 and the bottom side of the core that is proximal to substrate 110.

Cladding layer 315 may be disposed between core 310 and nanorod 115. Cladding layers 315 and 320 may protect the physical integrity of the core. Moreover, in some examples the cladding layers may comprise a material with a refractive index different than the refractive index of the core. This difference in the respective refractive indexes of the core and the cladding may enhance total internal reflection to allow the input light to resonate inside waveguide 305. The dimensions and material properties of the cladding layers may be chosen to allow for sufficient optical coupling between nanorod 115 and waveguide 305.

Moreover, in some examples the substrate may be absorbing in the wavelength range of the input light. In these examples a reflective layer (not shown) may be disposed on the substrate between the substrate and the waveguide. This reflective layer may reflect a portion of the input light that may be propagating from the waveguide towards the substrate back towards the waveguide, thereby reducing the likelihood of the input light being absorbed by the substrate. The reflective layers may comprise a material that is reflective in the wavelength range of the input light, such as metals, and the like.

Figure 4:
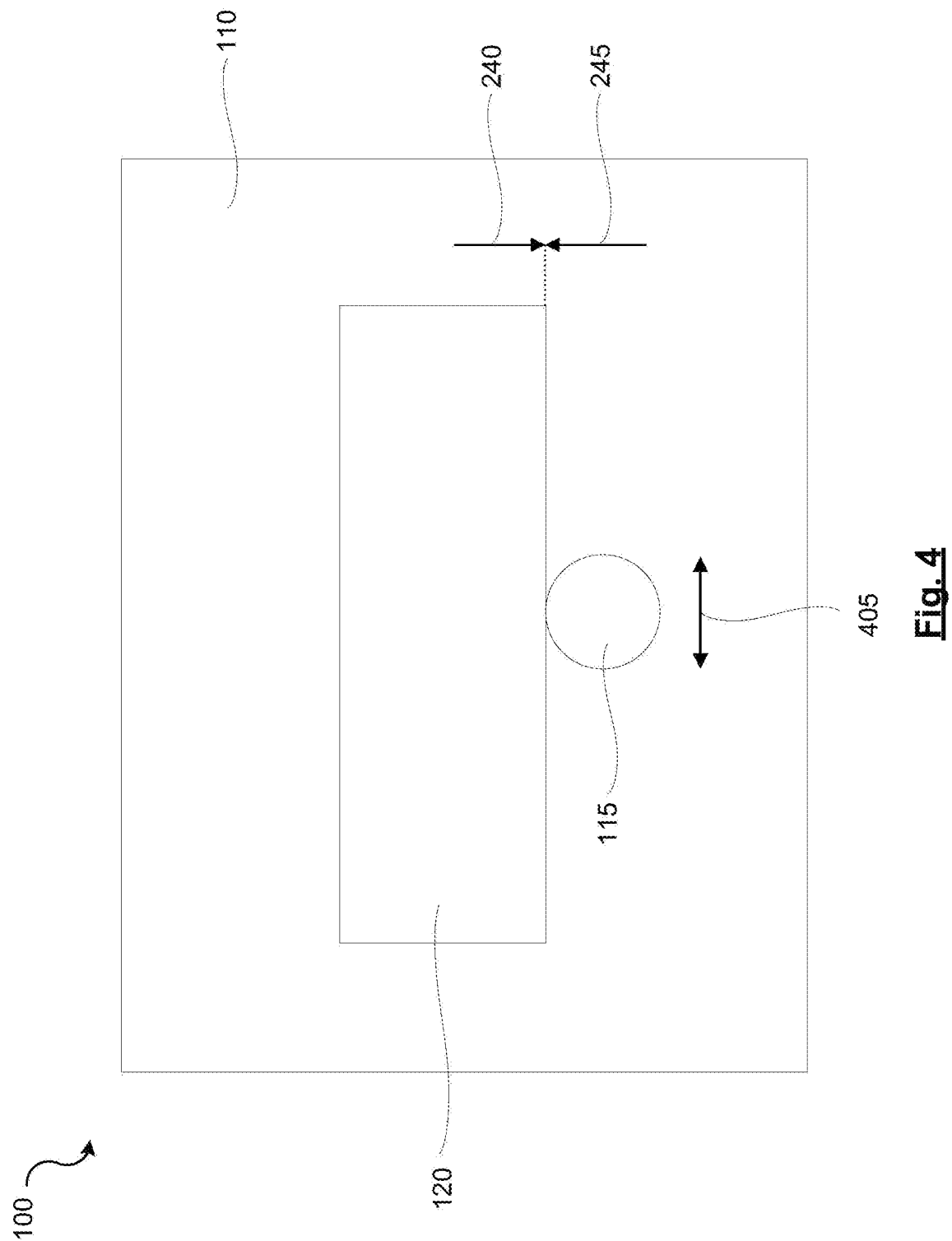
FIG. 4 shows a top plan view of the device of FIG. 1.

Turning now to FIG. 4, a top plan view of device 100 is shown. Arrows showing directions 240 and 245 illustrate that nanorod 115 and waveguide 120 contact with and abut against one another side-on, i.e. in the second direction in the plane defined by the first side of substrate 110. FIG. 4 also shows that the footprint of nanorod 115 on substrate 110 has a longest dimension 405. In some examples, this longest dimension may not exceed about 5 µm. In other examples, this longest dimension may not exceed about 2 µm. In other examples, this longest dimension may not exceed about 1 µm.

Nanorod 115 having a footprint on substrate 110 in the micron or smaller size ranges may reduce straining forces what would be caused due to lattice mismatches between the material of substrate 110 and the material of nanorod 115. This reduction in straining forces may in turn provide a greater choice of materials for substrate 110 as well as a greater choice of materials for nanorod 115. For example, many fabrication techniques and facilities already exist for fabrication on silicon substrates, and reducing or removing constraints imposed by lattice mismatches may allow fabrication of devices described herein using silicon substrates. In some examples, a further buffer layer may be formed between the silicon substrate and the QWSs such as nanorods, to assist in reducing straining forces that may be created by lattice mismatches between the QWS and the silicon substrate.

In addition, nanorods with diameters in the micron or smaller size range may be doped to a higher level compared to bulk materials. This is partly due to the relatively small quantity of material in the nanorod being able to accommodate to a higher degree than bulk materials the lattice defects and strains caused by dopants. This higher available range of doping levels may also increase choices in tailoring the electro-optical properties of the nanorods by tailoring the doping materials, levels, and distributions.

Moreover, in the micron or smaller size range the footprint of the nanorods may also start to create confinement effects on the electro-optical properties of the nanorods. In this size regime, changing the dimensions of the footprint may allow for tailoring the wavelength of the input light emitted by the nanorods.

Figure 5:
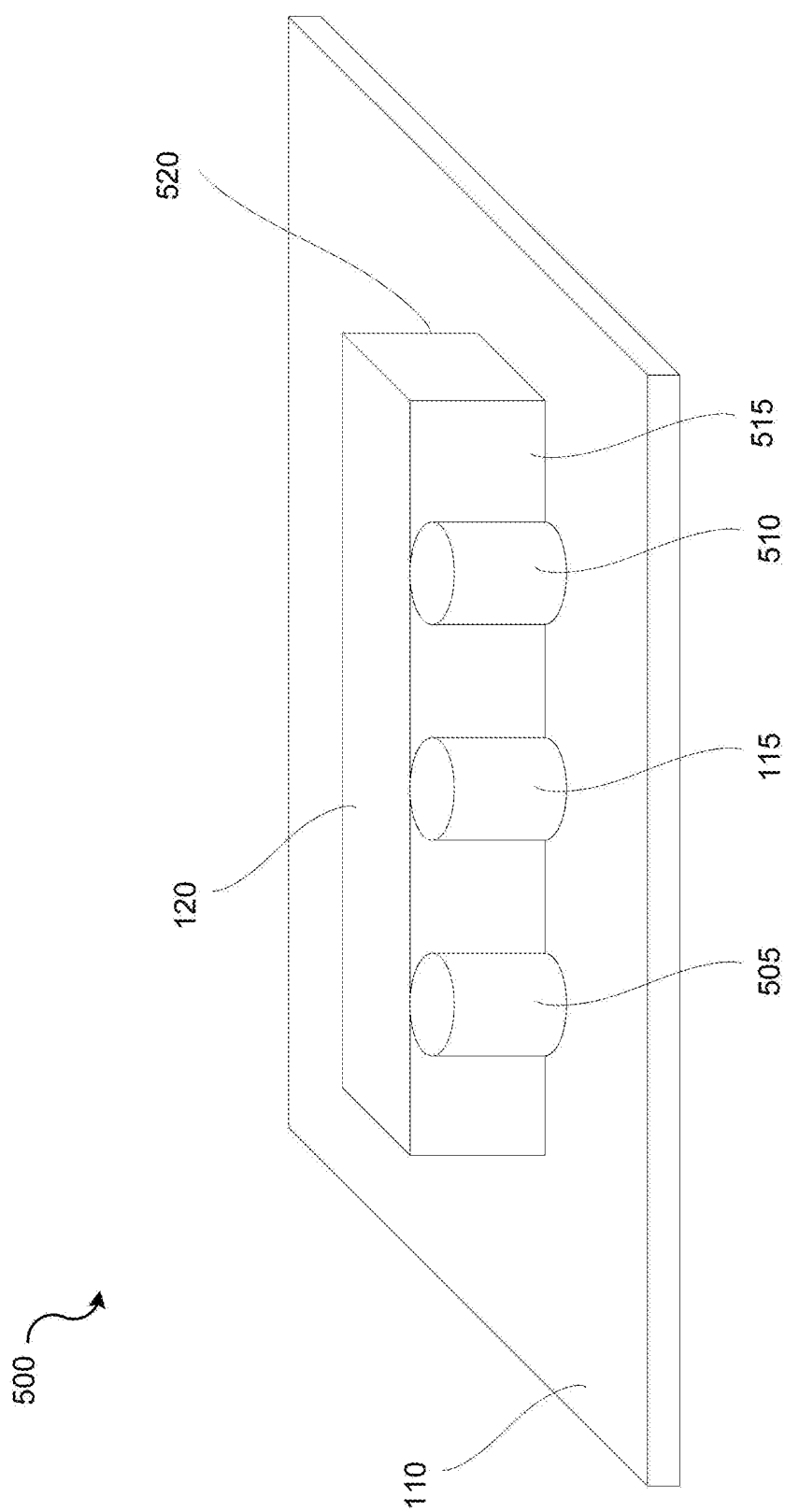
FIG. 5 shows a schematic top perspective view of yet another example device to generate an output light, in accordance with a non-limiting implementation of the present specification.

Turning now to FIG. 5, a schematic top perspective view of an example device 500 is shown. Device 500 may function in a manner similar to device to 100, and may share some of the same components as device 100. One difference between device 500 and device 100 is that device 500 comprises two additional nanorods 505 and 510, disposed on substrate 110 and abutting waveguide 120 side-on. Nanorods 505 and 510 may have the same structure and function as nanorod 115, and may be optically coupled with waveguide 120 in a manner similar to that of nanorod 115.

While FIG. 5 shows three identical nanorods 115, 505, and 510 disposed on the same side of waveguide 120, it is contemplated that in other examples two, four, or a different number of nanorods may be in contact with and optically coupled to waveguide 120. Furthermore, in some examples nanorods may be present on both sides of waveguide 120. For example, one or more nanorods may also be in side-on contact with a second side 520 of waveguide 120, which second side 520 may be opposite a first side 515 that is in contact with nanorods 115, 505, and 520.

In some examples, nanorods 115, 505, and 510 may emit respective input lights that comprise the same given wavelength, or may have respective light emission spectra that are about the same or at least partially overlapping. Moreover, in some examples the nanorods need not be identical, and may have diameters, heights, cross-sectional shapes, internal structures, or compositions that are different from one another.

Figure 6:
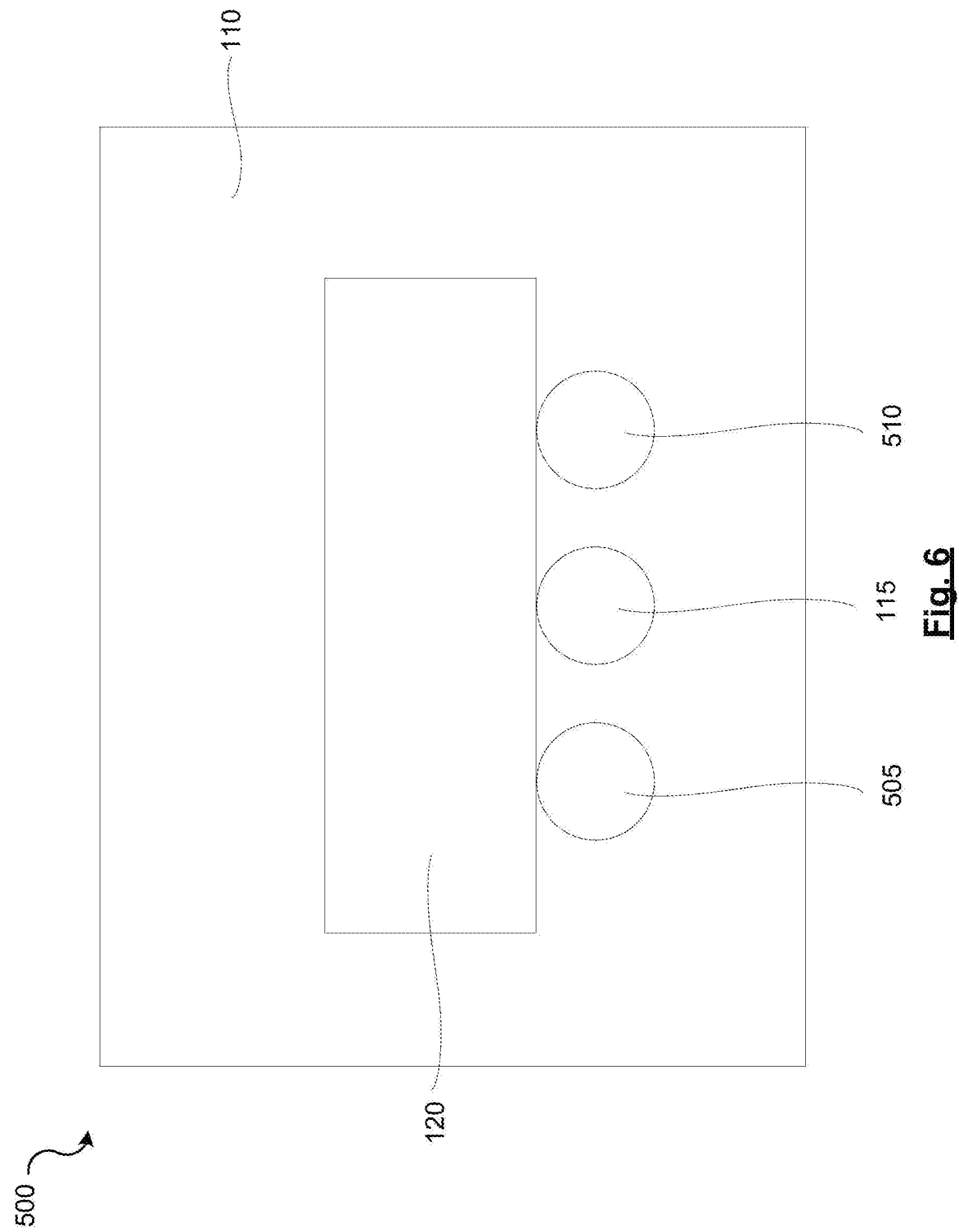
FIG. 6 shows a top plan view of the device of FIG. 5.
Figure 7:
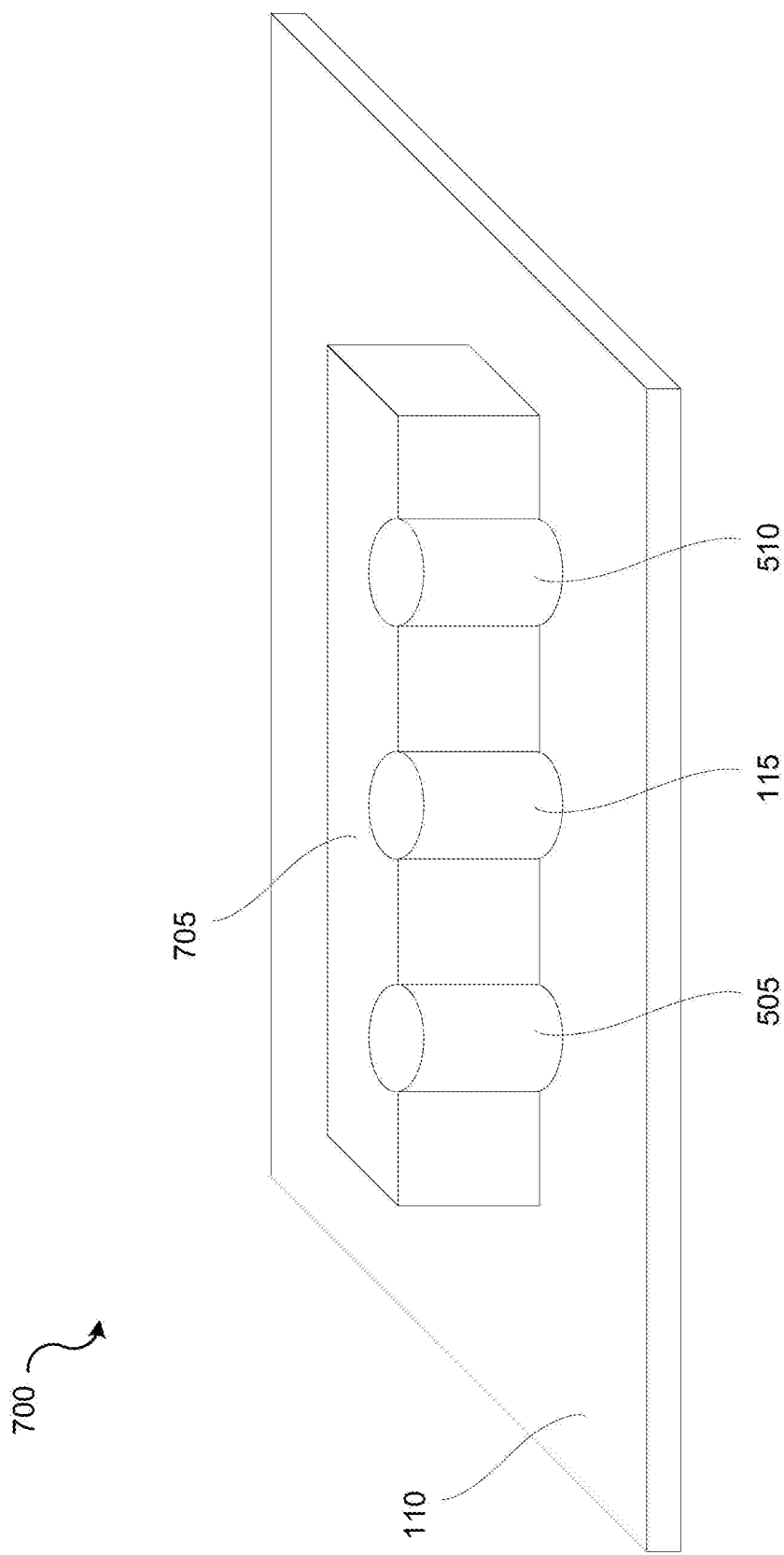
FIG. 7 shows a schematic top perspective view of yet another example device to generate an output light, in accordance with a non-limiting implementation of the present specification.

FIG. 6 shows a top plan view of device 500, which shows nanorods 115, 505, and 510 in abutting, side-on contact with waveguide 120. Turning now to FIG. 7, a schematic top perspective view of an example device 700 is shown. Device 700 may function in a manner similar to devices 100 and 500, and may share some of the same components as device 500. One difference between device 700 and device 500 is that in device 700 nanorods 115, 505, and 510 are partially disposed in a waveguide 705.

Positioning nanorods 115, 505, and 510 partially inside waveguide 705 may strengthen the optical coupling between the nanorods and waveguide 705. For example, at least a portion of the input light resonating in waveguide 705 may directly impinge upon at least a portion of nanorods 115, 505, and 510, thereby stimulating nanorods 115, 505, and 510 to emit further input light.

Figure 8:
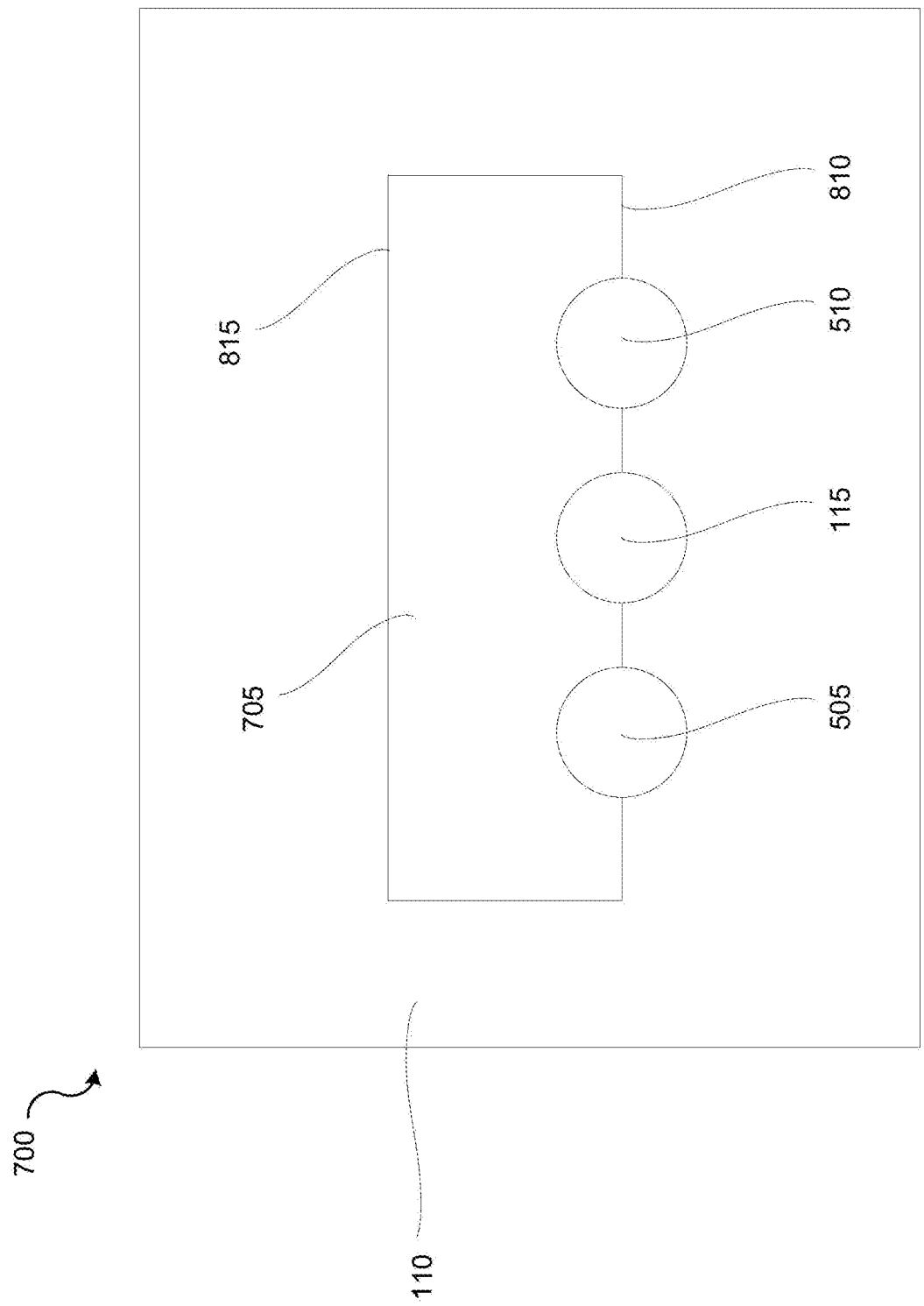
FIG. 8 shows a top plan view of the device of FIG. 7.

FIG. 8, in turn, depicts a top plan view of device 700, and shows that the footprint of nanorods 115, 505, and 510 on substrate 110 is partially disposed inside the footprint of waveguide 705 on substrate 110. Similar to device 500, it is contemplated that device 700 may comprise two, four, or a different number of nanorods, which nanorods may be the same as or different from one another. Furthermore, in some examples one or more nanorods may be in contact with, and partly disposed inside, a second side 815 of waveguide 705, in addition to or instead of the nanorods in contact with a first side 810 of waveguide 705.

FIG. 8 shows that nanorods 115, 505, and 510 are partially disposed in waveguide 705 to the same extent. In other words, nanorods 115, 505, and 510 are disposed inside waveguide 705 such that about half of the footprint of nanorods 115, 505, and 510 is inside the footprint of waveguide 705. It is contemplated that in some examples the nanorods may be partially disposed in the waveguide to an extent different than about half-way. Moreover, in some examples the nanorods may be partially disposed in the waveguide to an extent different from one another.

Figure 9:
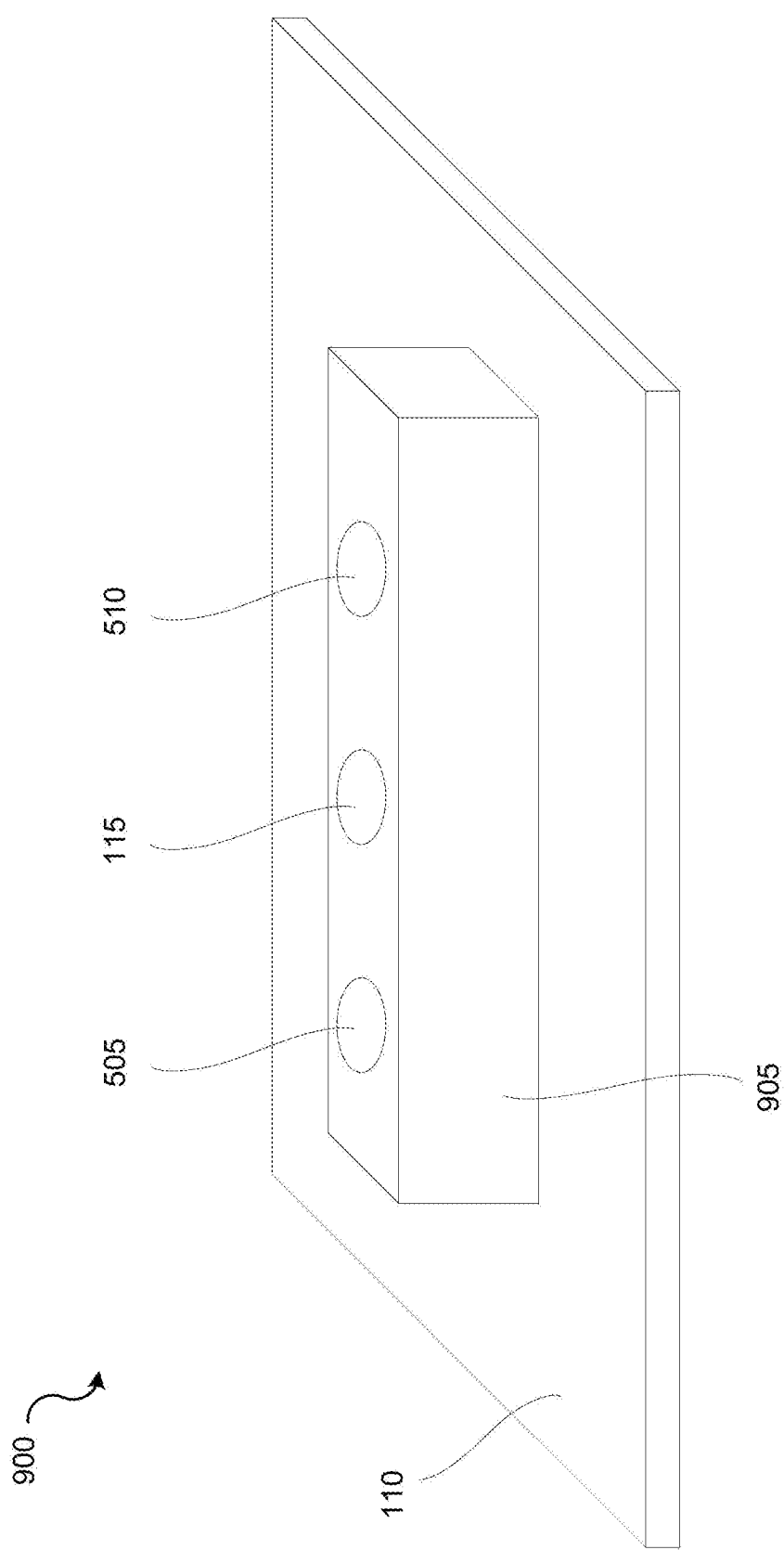
FIG. 9 shows a schematic top perspective view of yet another example device to generate an output light, in accordance with a non-limiting implementation of the present specification.

Turning now to FIG. 9, a schematic top perspective view of an example device 900 is shown. Device 900 may function in a manner similar to device 700, and may share some of the same components as device 700. One difference between device 900 and device 700 is that in device 900 nanorods 115, 505, and 510 are received inside a waveguide 905 such that a footprint of nanorods 115, 505, and 510 on substrate 110 is positioned in the footprint of waveguide 905 on substrate 110. In addition, FIG. 9 shows the tops of nanorods 115, 505, and 510 as being on the same plane as the top of waveguide 905. It is also contemplated that in some examples nanorods 115, 505, and 510 may be received or enclosed in the waveguide, such that the tops of the nanorods may not be on the same plane as the top of the waveguide. It is also contemplated that in some examples nanorods 115, 505, and 510 may extend beyond the top of the waveguide. Such a design may be helpful for connecting an electrical power source to the top of each nanorod.

Figure 10:
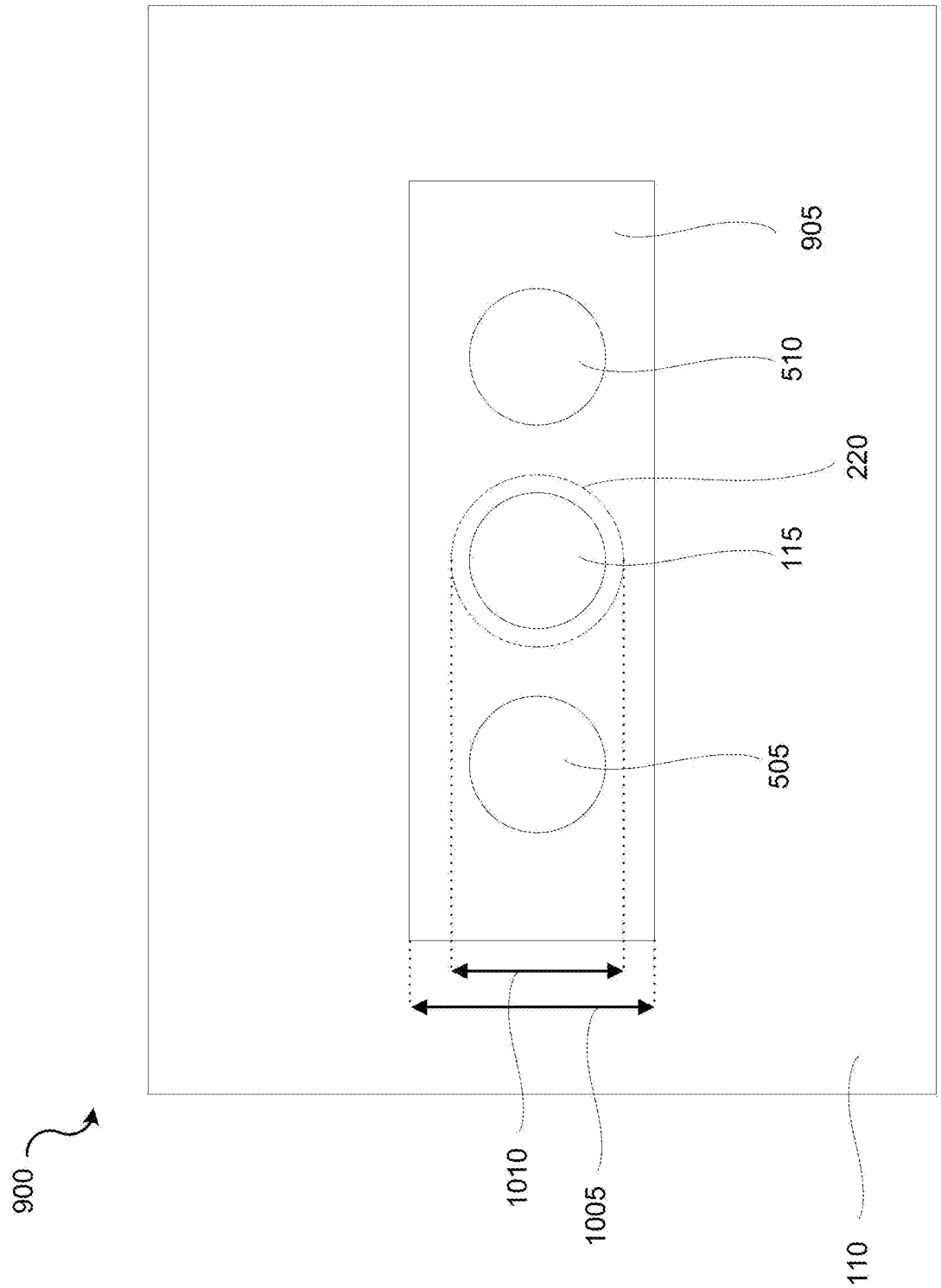
FIG. 10 shows a top plan view of the device of FIG. 9.

FIG. 10 shows a top plan view of device 900. Positioning the footprint of nanorods 115, 505, and 510 inside the footprint of waveguide 905 may strengthen the optical coupling between the nanorods and the waveguide by allowing the input light resonating in waveguide 905 to impinge upon the full light emitting region of the nanorods. In addition, in some examples the waveguide may be dimensioned to contain most of the optical field of the light generated by the nanorods. For example, as shown in FIG. 10, a width 1005 of waveguide 905 may be selected to be larger than a lateral extent 1010 of optical field 220 generated by nanorod 115. Nanorods 505 and 510 may also emit light having corresponding optical fields, which fields are not shown in FIG. 10 for ease and clarity of illustration.

Given that the strength of the optical field generated by the nanorods may diminish as a function of increasing distance from the nanorods, the waveguide may be dimensioned to have a width that extends a given distance laterally outside of the nanorods to overlap with or capture a corresponding given percentage of the optical field strength or energy generated by the nanorods. By increasing the size, e.g. lateral width, of the waveguide relative to the nanorods, the given percentage of the optical field captured by the waveguide may be increased.

Similar to devices 500 and 700, in the case of device 900 it is contemplated that two, four, or a larger number of nanorods may be optically coupled with the waveguide. These nanorods may be the same, or may be different from one another. In addition, while FIG. 10 shows the three nanorods positioned on the longitudinal center-line of waveguide 905, it is contemplated that in other examples, the nanorods may be positioned differently inside the waveguide. For example, the nanorods may be distributed to form a periodically ordered array, which array may then interact with the input light resonating in waveguide 905. For example, the periodicity of the ordered array of nanorods may be selected to allow the array to act as a distributed Bragg reflector for at least some of the light resonating in waveguide 905. Moreover, in some examples the size of the nanorods and their distribution may be selected to allow the array of nanorods to act as an active or passive metasurface in interacting with the light resonating in the waveguide.

Moreover, in examples where nanorods are positioned partially or fully inside the waveguide such that the light resonating in the waveguide may impinge upon the waveguide, some of the impinging light may be reflected from the interface of the waveguide and the nanorod due to possible mismatches in the indexes of refraction of the waveguide and the nanorod. To reduce these reflections, the materials of the waveguide and the nanorods may be chosen to reduce the difference between the indexes of refraction of the two. If this type of index-matching is not practicable, an anti-reflective layer may be disposed at the interface between the nanorods and the waveguide. In some examples, this anti-reflective layer may be disposed on at least a portion of the nanorods at the interface between the nanorods and the waveguide. Examples of such anti-reflective layers may include ¼ wave anti-reflective coatings, and the like.

Turning now to FIG. 11, a top plan view of an example device 1100 is shown. Device 1100 may function in a manner similar to device 900, and may share some of the same components as device 900. One difference between device 1100 and device 900 is that in device 1100 nanorods 1105, 1110, and 1115 have a core-shell-shell structure. For example, nanorod 1105 comprises a core 1120, an inner shell 1125, and an outer shell 1130, all oriented along the axial dimension of nanorod 1105. Inner shell 1125 may be quantum-confined between core 1120 and outer shell 1130, and may emit input light when electrically biased. Nanorods 1110 and 1115 may have a structure similar to nanorod 1105.

While nanorods 1105, 1110, and 1115 are shown as having three concentric layers, it is contemplated that in some examples the nanorods may have additional layers, which layers may be oriented as further concentric shells or oriented in a different manner. In some examples, such nanorods with more than three layers may have more than one quantum-confined layer in a given nanorod, which layers may emit light when biased electrically.

Furthermore, while FIG. 11 shows nanorods 1105, 1110, and 1115 as having the same size and structure, it is contemplated that in some examples nanorods 1105, 1110, and 1115 may have sizes, structures, or compositions that are different from one another. Moreover, in some examples device 1100 may comprise a mixture of core-shell-shell nanorods similar to nanorods 1105, 1110, and 1115 and one or more nanorods where the layers of the quantum well are stacked along the axial direction, similar to nanorod 115 (shown in FIG. 2).

In addition, in some examples device 1100 may comprise one, two, four, or a different number of core-shell-shell nanorods. Furthermore, in some examples the core-shell-shell nanorods may contact the waveguide in a manner different than the footprint of the nanorods being inside the footprint of the waveguide. For example, the core-shell-shell nanorods may be disposed beside the waveguide and abut the waveguide side-on similar for example to device 500. In other examples, the core-shell-shell nanorods may be disposed partially inside the nanorods, similar for example to device 700.

As discussed above, keeping the footprint of the nanorods relatively small on the substrate may allow for greater lattice mismatches to be tolerated and may allow for added tunability of the wavelength of the input light by adjusting the dimensions of the footprint. Extending the footprint of the nanorod along one dimension on the substrate may form a nanowall structure. Such a nanowall may be formed as, or may comprise a, quantum well comprising a middle layer sandwiched and quantum-confined between two outer layers. As such, the nanowall may be or comprise a QWS.

Moreover, so long as the lateral dimension of the footprint of the nanowall, i.e. the thickness of the nanowall, is relatively small, the nanowall may also exhibit greater tolerance for lattice mismatches with the substrate, and the wavelength of the light emitted by the quantum-confined layer of the nanowall may also be tuneable by adjusting the thickness of the wall. In some examples, the nanowall may have a lateral dimension not exceeding about 5 µm. In other examples, this longest dimension may not exceed about 2 µm. In other examples, this longest dimension may not exceed about 1 µm. Limiting the lateral dimension to not exceed such small sizes can provide or enhance the properties of lattice mismatch tolerance and thickness-based wavelength tunability described above.

Figure 12:
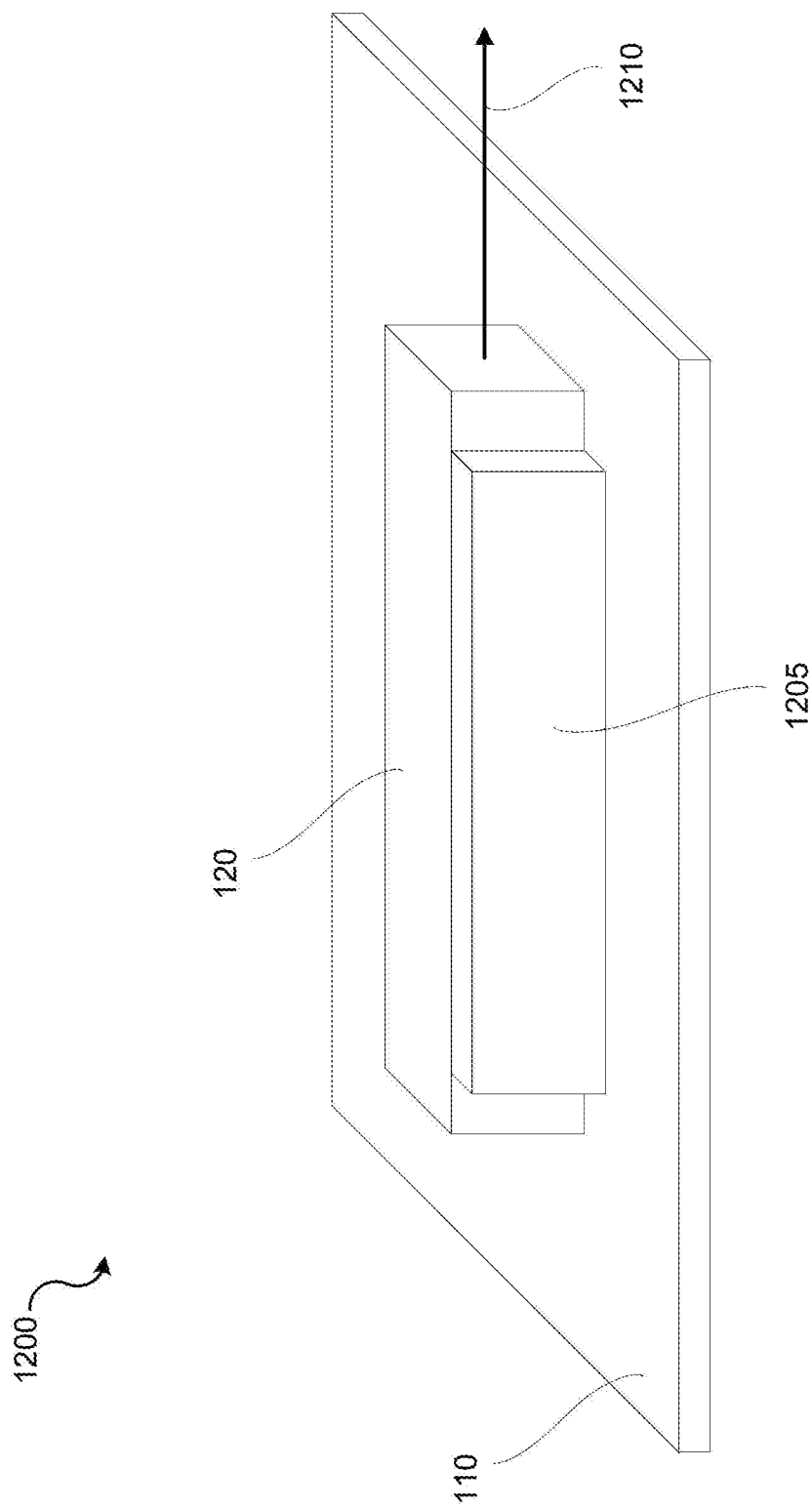
FIG. 12 shows a schematic top perspective view of yet another example device to generate an output light, in accordance with a non-limiting implementation of the present specification.

Turning now to FIG. 12, a schematic top perspective view of an example device 1200 is shown, which device 1200 may be used to generate an output light 1210. Output light 1210 may be similar to output light 105. In addition, device 1200 may function in a manner similar to device 100, and may share some of the same components as device 100. One difference between device 1200 and device 100 is that in device 1200 the QWS which emits the input light comprises a nanowall 1205, whereas in device 100 the QWS comprises nanorod 115.

Nanowall 1205 is disposed on substrate 110 side-by-side with waveguide 120, and contacts waveguide 120 in the lateral or second direction. The contact between nanowall 1205 and waveguide 120 may also be described as being side-on. Nanowall 1205 has a height dimension along first direction 235 (shown in FIG. 2). Moreover, a front side elevation cross-sectional view of device 1200 may be similar to the cross-sectional view shown in FIG. 2. In other words, nanowall 1205 may comprise a first, a second, and a third layer stacked along the height dimension of the nanowall, similar to layers 205, 210, and 215 shown in FIG. 2.

Figure 13:
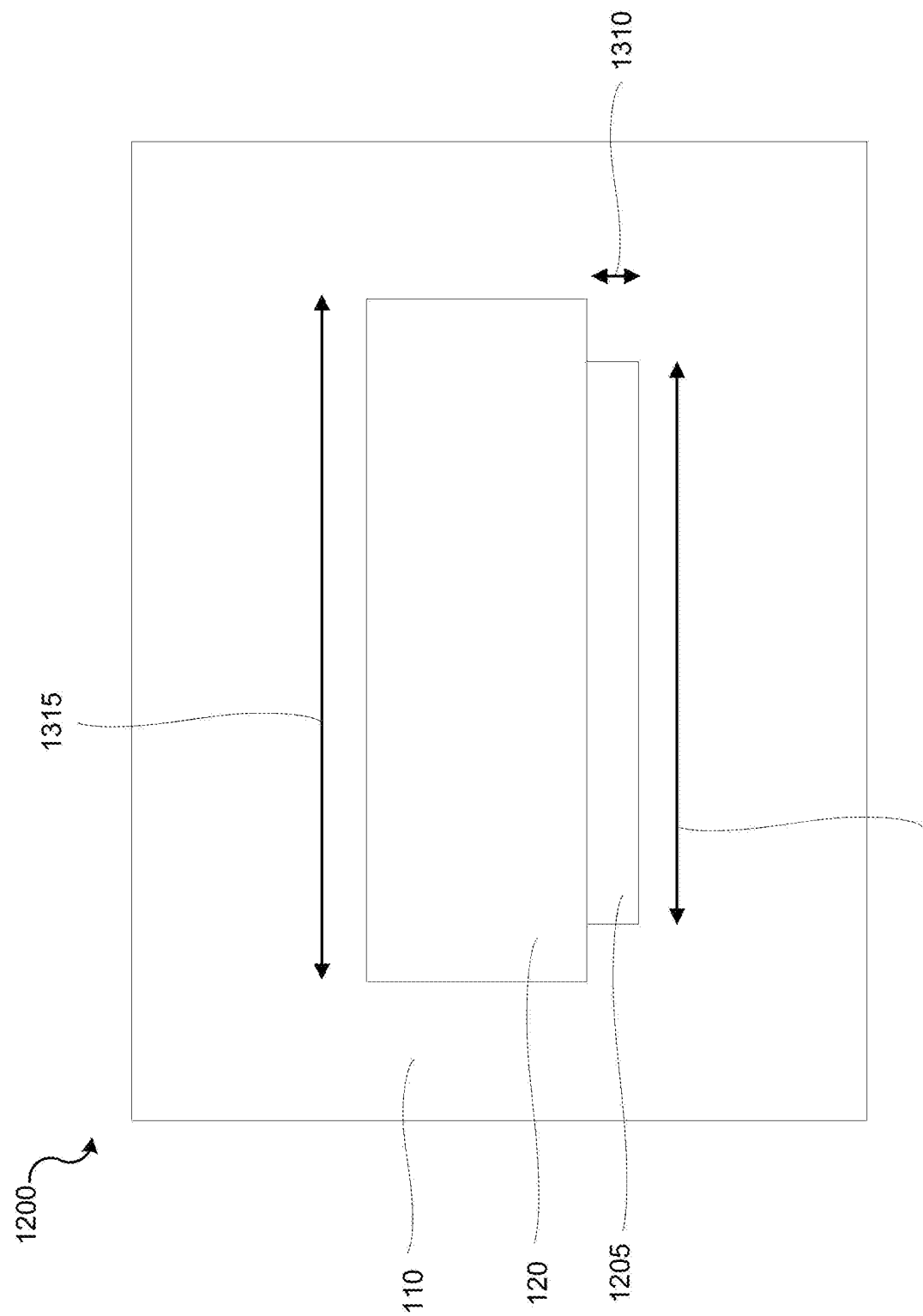
FIG. 13 shows a top plan view of the device of FIG. 12.

FIG. 13, in turn, shows a top plan view of device 1200. As shown in FIG. 13, nanowall 1205 has an elongated footprint on substrate 110. This elongated footprint has a longitudinal dimension 1305 and a lateral dimension 1310 lateral to longitudinal dimension 1305. Lateral dimension 1310 represents the thickness of nanowall 1205. In some examples, lateral dimension 1310 may be equal to or less than about 5 µm. In other examples, lateral dimension 1310 may be equal to or less than about 2 µm. In other examples, lateral dimension 1310 may be equal to or less than about 1 µm.

As shown in FIG. 13, waveguide 120 comprises an elongated member that has a corresponding longitudinal dimension 1315. Moreover, FIG. 13 shows that longitudinal dimension 1305 of nanowall 1205 is oriented about parallel to longitudinal dimension 1315 of waveguide 120. In other words, waveguide 120 and nanowall 1205 are side-by-side and extend alongside one another.

Figure 14:
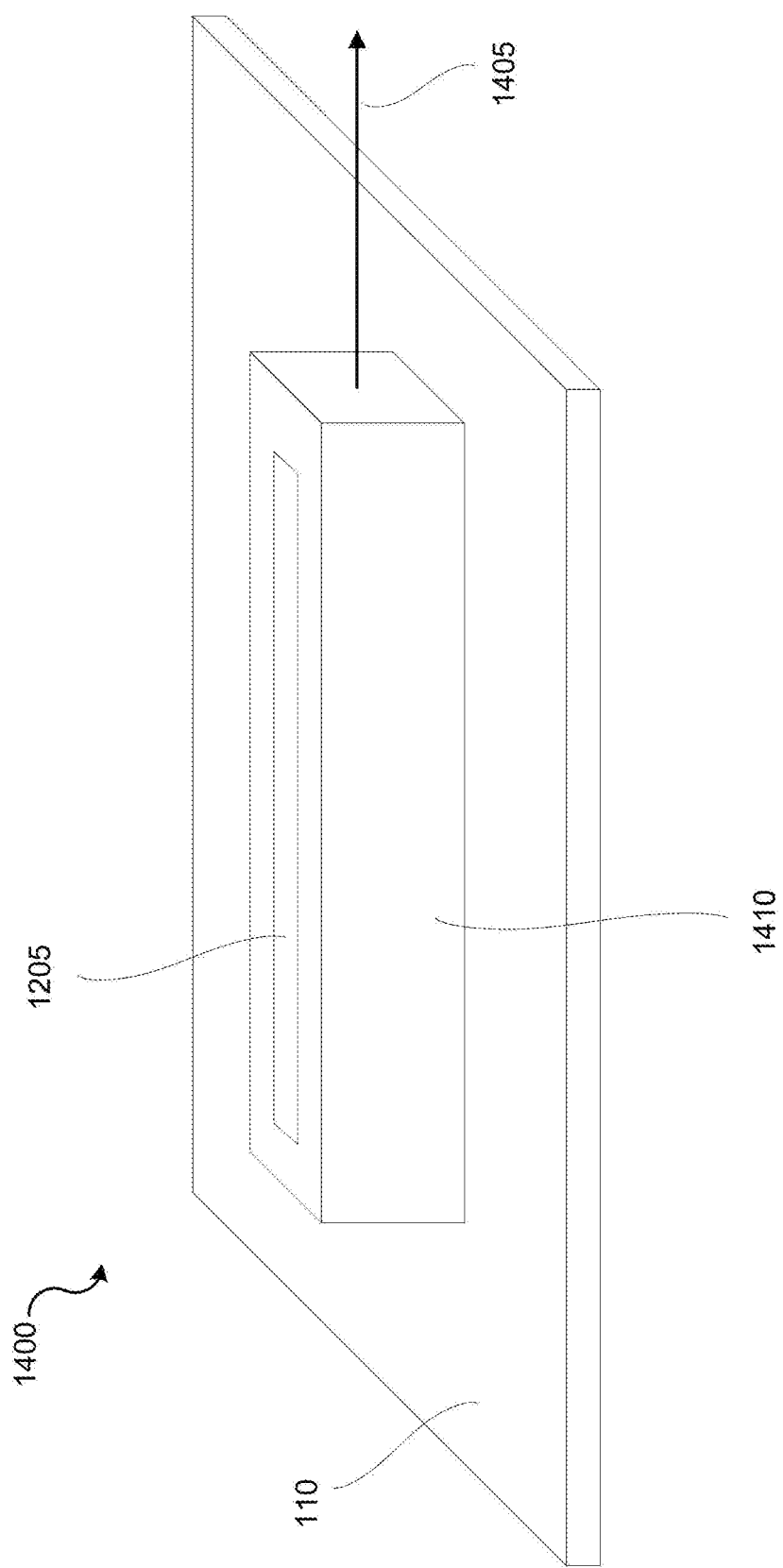
FIG. 14 shows a schematic top perspective view of yet another example device to generate an output light, in accordance with a non-limiting implementation of the present specification.

Turning now to FIG. 14, a schematic top perspective view of an example device 1400 is shown, which device 1400 may generate an output light 1405. Output light 1405 may be similar to output light 105. In addition, device 1400 may function in a manner similar to device 1200, and may share some of the same components as device 1200. One difference between device 1400 and device 1200 is that in device 1400 nanowall 1205 is positioned on substrate 110 such that the footprint of nanowall 1205 on the substrate 110 is disposed inside the footprint of a waveguide 1410 on substrate 110.

Figure 15:
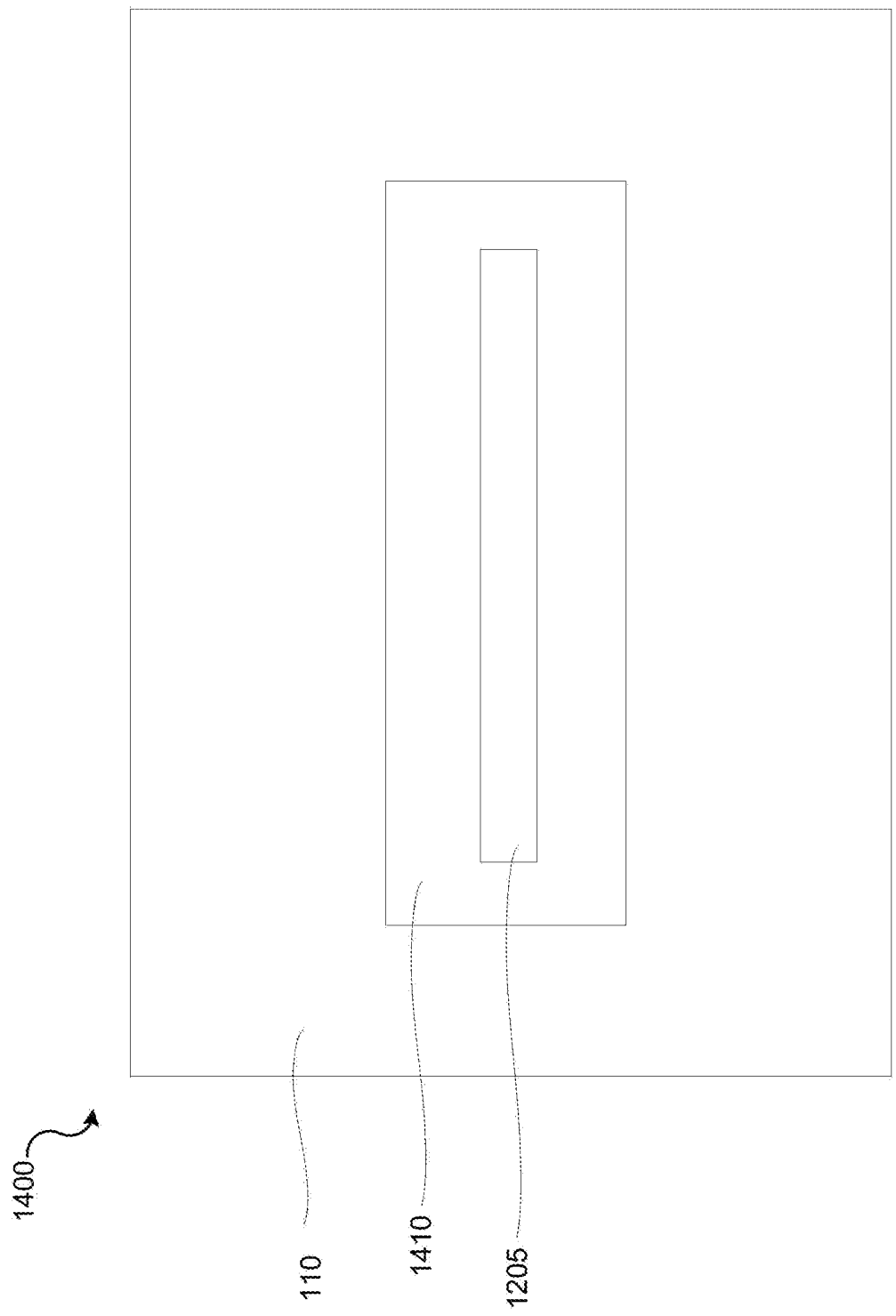
FIG. 15 shows a top plan view of the device of FIG. 14.

FIG. 15 shows a top plan view of device 1400, and illustrates the positioning of the footprints of nanowall 1205 and waveguide 1410 relative to one another. The features, functionalities, and variations described in relation to device 900 may also generally apply to device 1400. Furthermore, it is contemplated that in some examples nanowall 1205 may be partially disposed inside the waveguide. The features, functionalities, and variations described in relation to device 700 may also generally apply to such examples.

Figure 16:
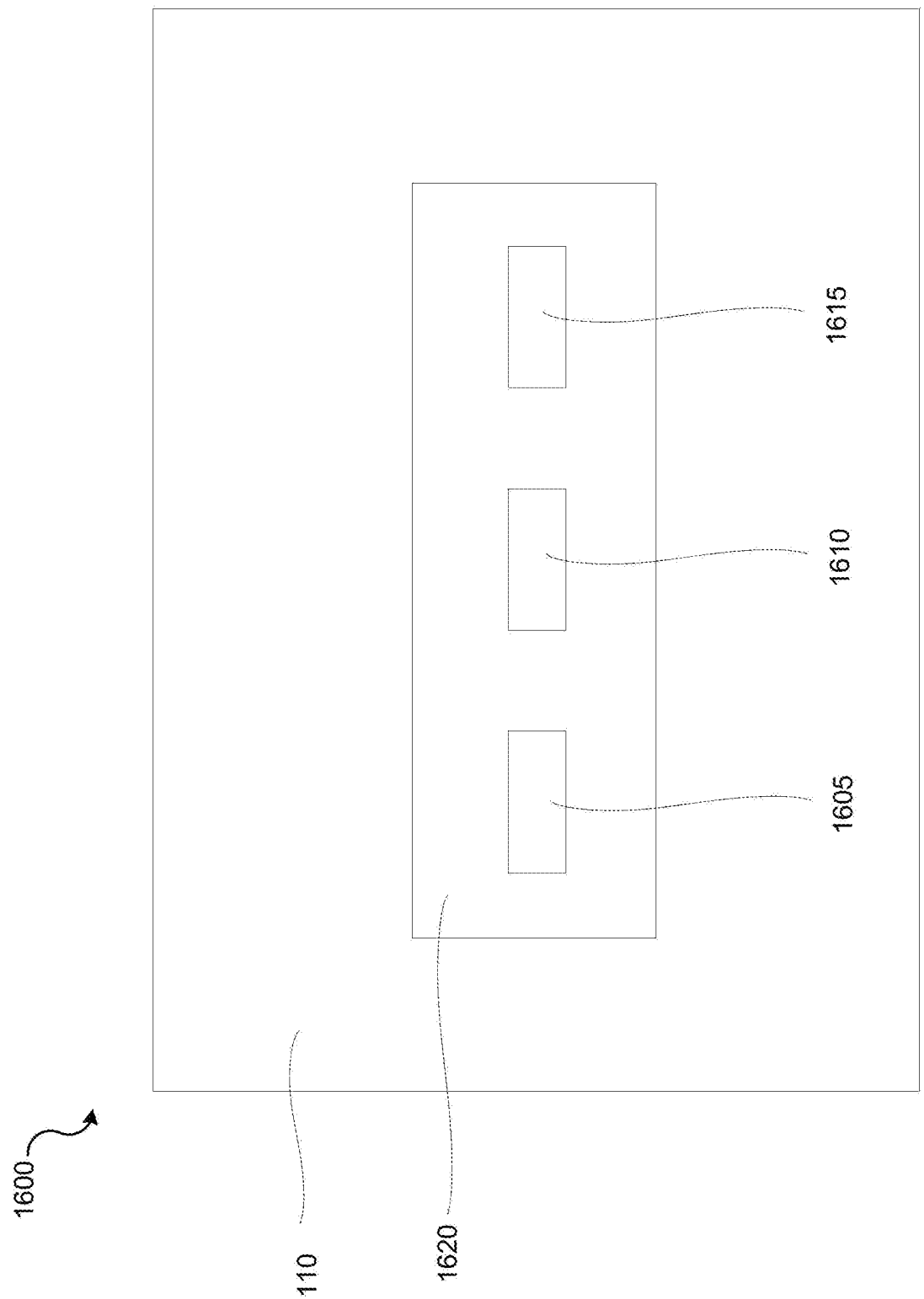
FIG. 16 shows a schematic top plan view of yet another example device to generate an output light, in accordance with a non-limiting implementation of the present specification.

FIG. 16, in turn, shows a top plan view of an example device 1600. Device 1600 may function in a manner similar to device 1400, and may share some of the same components as device 1400. One difference between device 1600 and device 1400 is that device 1600 comprises three nanowall segments 1605, 1610, and 1615 instead of the one nanowall 1205 present in device 1400. Moreover, nanowall segments 1605, 1610, and 1615 are positioned on substrate 110 such that their footprints are disposed inside the footprint of a waveguide 1620.

While FIG. 16 shows three identical nanowall segments 1605, 1610, and 1615 disposed along a longitudinal centerline of waveguide 1620, it is contemplated that in some examples the nanowall segments 1605, 1610, and 1615 may be different from one another in size, shape, or composition. Moreover, it is contemplated that in some examples nanowall segments 1605, 1610, and 1615 may be oriented or positioned within waveguide 1620 differently than the positioning and orientation shown in FIG. 16. Furthermore, in some examples device 1600 may comprise one, two, four or a different number of nanowall segments. In addition, in some examples the nanowall segments may be outside of and abutting the waveguide. Moreover, in some examples the nanowall segments may be partially disposed inside the waveguide.

Figure 17:
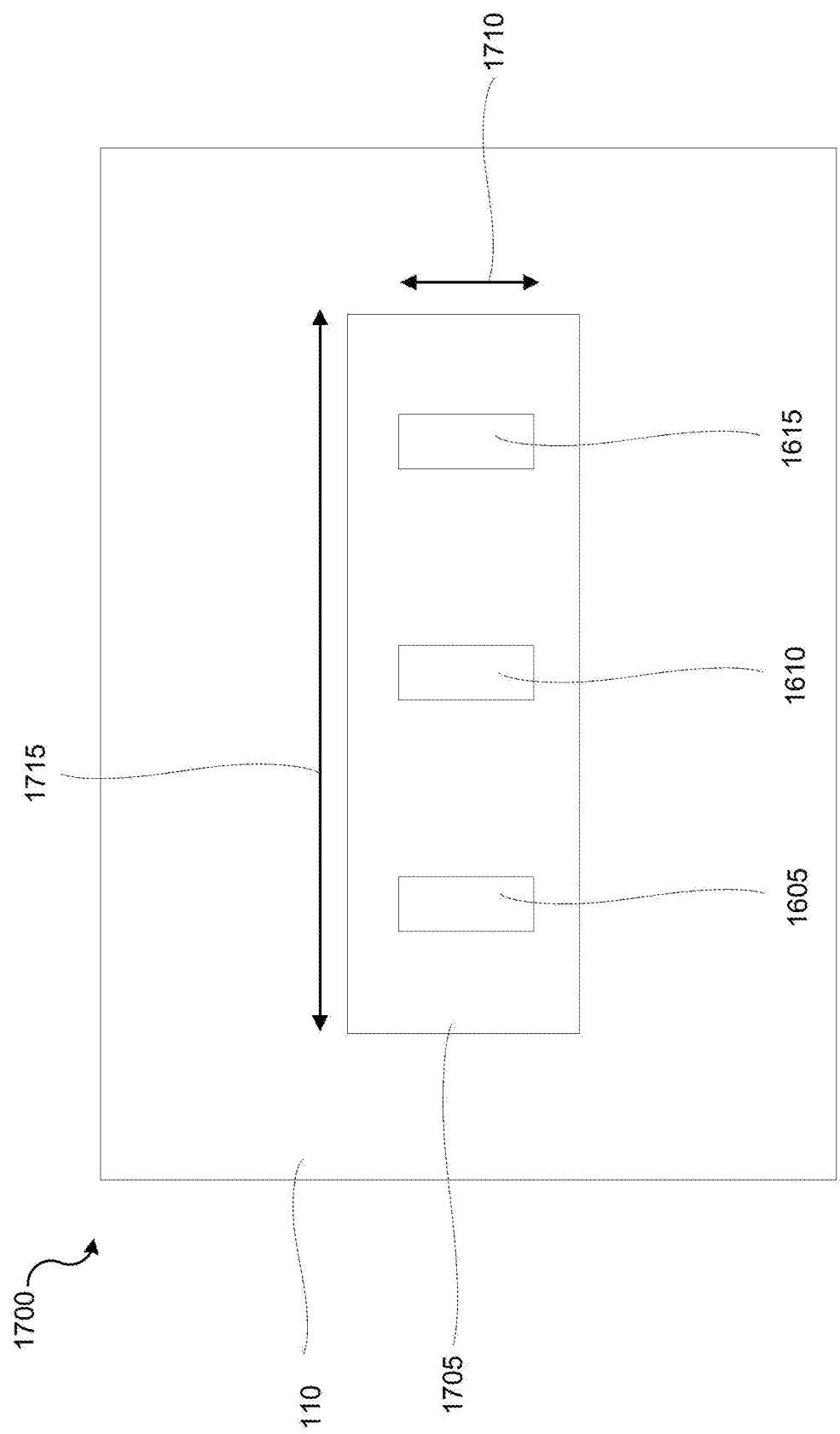
FIG. 17 shows a schematic top plan view of yet another example device to generate an output light, in accordance with a non-limiting implementation of the present specification.

FIG. 17 shows a top plan view of an example device 1700. Device 1700 may function in a manner similar to device 1600, and may share some of the same components as device 1600. One difference between device 1700 and device 1600 is that in device 1700 the orientations of nanowall segments 1605, 1610, and 1615 relative to waveguide 1705 are different than the orientations of nanowall segments 1605, 1610, and 1615 in waveguide 1620. In device 1700, nanowall segments 1605, 1610, and 1615 are oriented such that the longitudinal dimension of their footprint 1710 on substrate 110 is about perpendicular to the longitudinal dimension 1715 of waveguide 1705.

In some examples, the optical properties, size, and positioning of nanowall segments may be chosen to produce a given interaction between the nanowall segments and the input light resonating in the waveguide. For example, the nanowall segments may be positioned and oriented to function as a distributed Bragg reflector, to selectively reflect some wavelengths of the light resonating in the waveguide.

Turning now to FIG. 18, a top plan view of an example device 1800 is shown. Device 1800 may function in a manner similar to device 1700, and may share some of the same components as device 1700. One difference between device 1800 and device 1700 is that in device 1800 the orientations of nanowall segments 1605, 1610, and 1615 relative to waveguide 1805 are different than the orientations of nanowall segments 1605, 1610, and 1615 in waveguide 1705. In device 1800, nanowall segments 1605, 1610, and 1615 are oriented such that the longitudinal dimension of their footprint on substrate 110 is at an angle to the longitudinal dimension of waveguide 1805.

The angle between the nanowall segments and the longitudinal dimension of the waveguide may be selected to produce or enhance a given interaction between the nanowall segments and the light resonating in the waveguide. For example, the nanowall segments may be oriented at Brewster's angle to reduce a subset of the reflections of the resonating light from the nanowall segments.

The devices shown in FIG. 1-18 comprise waveguides that are shaped as substantially straight rectangular prisms. It is contemplated that in some examples the waveguide need not be shaped as a rectangular prism. For example, the waveguide may be curved or bent in its longitudinal dimension, or may have a cross-sectional shape that is different than a rectangle. FIG. 19A shows a top plan view of an example device 1900 which comprises a ring-shaped waveguide.

Device 1900 comprises a ring-shaped waveguide 1905, disposed on substrate 110. Waveguide 1905 comprises an outlet arm 1910, which is tangential to the ring structure of waveguide 1905. Outlet arm 1910 may act as an optical outlet of device 1900. As the input light travels around, i.e. resonates in, the ring of waveguide 1905, some of the resonating light may leave the ring through outlet arm 1910 to form an output light 1915. Output light 1915 may be similar to output light 105.

Device 1900 also comprises a first nanowall 1920 which runs along a portion of an outer perimeter 1925 of waveguide 1905 and a second nanowall 1930 which runs along an inner perimeter 1935 of waveguide 1905. Nanowalls 1920 and 1930 may be in side-on contact with waveguide 1905, and may be optically coupled with waveguide 1905. Moreover, nanowalls 1920 and 1930 may be similar in function and composition to nanowall 1205.

While FIG. 19A shows device 1900 as having nanowalls running along both its inner and outer perimeters, it is contemplated that in some examples device 1900 may have a nanowall along one of its inner or outer perimeters. Moreover, in some examples the nanowalls need not extend along the full inner or outer perimeter of waveguide 1905, and may extend along a portion of the inner or outer perimeter of waveguide 1905. Furthermore, in some examples one or more nanorods, nanowall segments, or other types of QWS may be optically coupled to waveguide 1905 instead of or in addition to nanowalls 1920 and 1930.

Figure 19B:
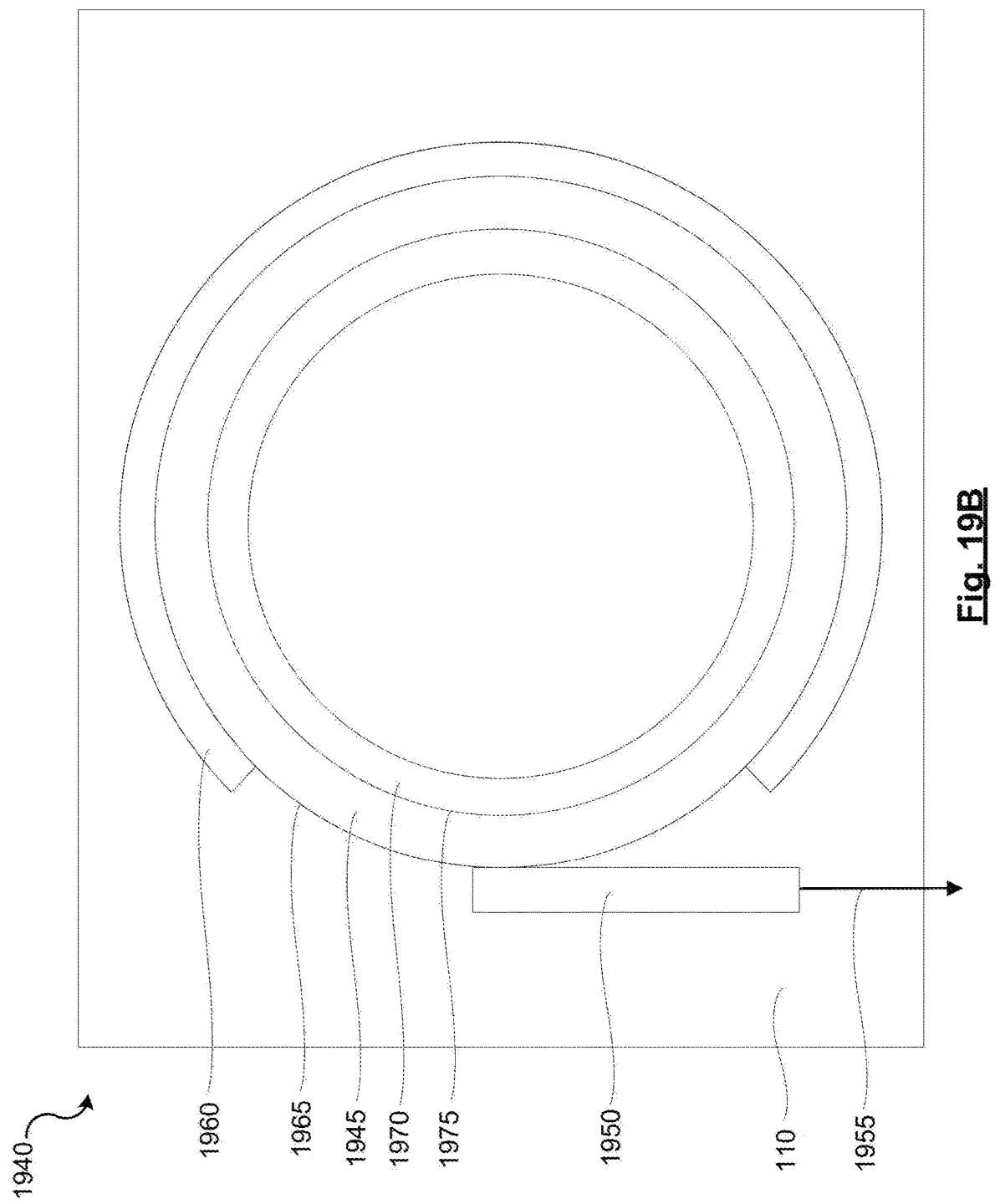
FIG. 19B shows a schematic top plan view of yet another example device to generate an output light, in accordance with a non-limiting implementation of the present specification.

FIG. 19B, in turn, shows a top plan view of an example device 1940 which comprises a ring-shaped waveguide 1945, disposed on substrate 110. Device 1940 also comprises an outlet arm 1950, which is optically coupled to waveguide 1945. Outlet arm 1950 may act as an optical outlet of device 1940. As the input light travels around, i.e. resonates in, the ring of waveguide 1945, some of the resonating light may be optically coupled into outlet arm 1950 to form an output light 1955. Output light 1955 may be similar to output light 1915.

Outlet arm 1950 may comprise a waveguide that is disposed on substrate 110, and is side-by-side with waveguide 1945. Outlet arm 1950 may be in side-on abutting contact with waveguide 1945. The optical coupling between outlet arm 1950 and waveguide 1945 may be similar to the optical coupling between nanorod 115 and the resonating input light in waveguide 120, as described herein in relation to device 100.

While FIG. 19B shows waveguide 1945 and outlet arm 1950 as being in abutting contact with one another, it is contemplated that in some examples the outlet arm and the waveguide may be spaced from one another, and need not come into contact. In such examples, the space between the outlet arm and the waveguide may reduce or weaken the optical coupling between the outlet arm and the waveguide. Furthermore, in some examples the outlet arm and the waveguide may be integrally formed as a single optical component. In such examples, some of the light resonating in the waveguide may propagate into the outlet arm and exit the waveguide to form the output light.

Device 1940 also comprises a first nanowall 1960 which runs along a portion of an outer perimeter 1965 of waveguide 1945 and a second nanowall 1970 which runs along an inner perimeter 1975 of waveguide 1945. Nanowalls 1960 and 1970 may be in side-on contact with waveguide 1945, and may be optically coupled with waveguide 1945. Moreover, nanowalls 1960 and 1970 may be similar in function and composition to nanowalls 1920 and 1930.

While FIG. 19B shows device 1940 as having nanowalls running along both its inner and outer perimeters, it is contemplated that in some examples device 1940 may have a nanowall along one of its inner or outer perimeters. Moreover, in some examples a nanowall need not extend along the full inner perimeter of waveguide 1945, and may extend along a portion of the inner perimeter of waveguide 1945. In addition, while FIG. 19B shows nanowall 1960 running along a given portion of outer perimeter 1965 of waveguide 1945, it is contemplated that in some examples a nanowall may run along a longer, shorter, or different portion of outer perimeter 1965 of waveguide 1945. Furthermore, in some examples one or more nanorods, nanowall segments, or other types of QWS may be optically coupled to waveguide 1945 instead of or in addition to nanowalls 1960 and 1970.

In some examples, the ring-shaped waveguides 1905 and 1945 may be optically coupled to one or more nanorods, nanowalls, or nanowall segments which may be outside and abutting the waveguide, partially inside the waveguide, or have footprints that are disposed inside the footprint of the waveguide on the substrate. Moreover, in some examples the devices described herein in relation to FIGS. 1-18 may be fabricated using curved or ring-shaped waveguides such as waveguides 1905 and 1945.

As discussed above, the size, shape, and composition of the QWS such as nanorods and nanowalls may be used to tune the wavelength of the input light emitted by the QWS. The size, shape, material composition and optical properties of the resonance cavity formed in the waveguide may also be used to further select or narrow down the wavelengths of input light that may resonate inside the resonance cavity, and may be emitted from the resonance cavity as the output light of the device.

By selecting the properties of the QWSs emitting the input light and the properties of the resonance cavity, the devices may be tuned to emit output light that comprises a given range of wavelengths. For some applications, such as image projection, light of three different well-defined colors, i.e. relatively narrow wavelength ranges, may be used to produce the color gamut of the image being projected.

Figure 20:
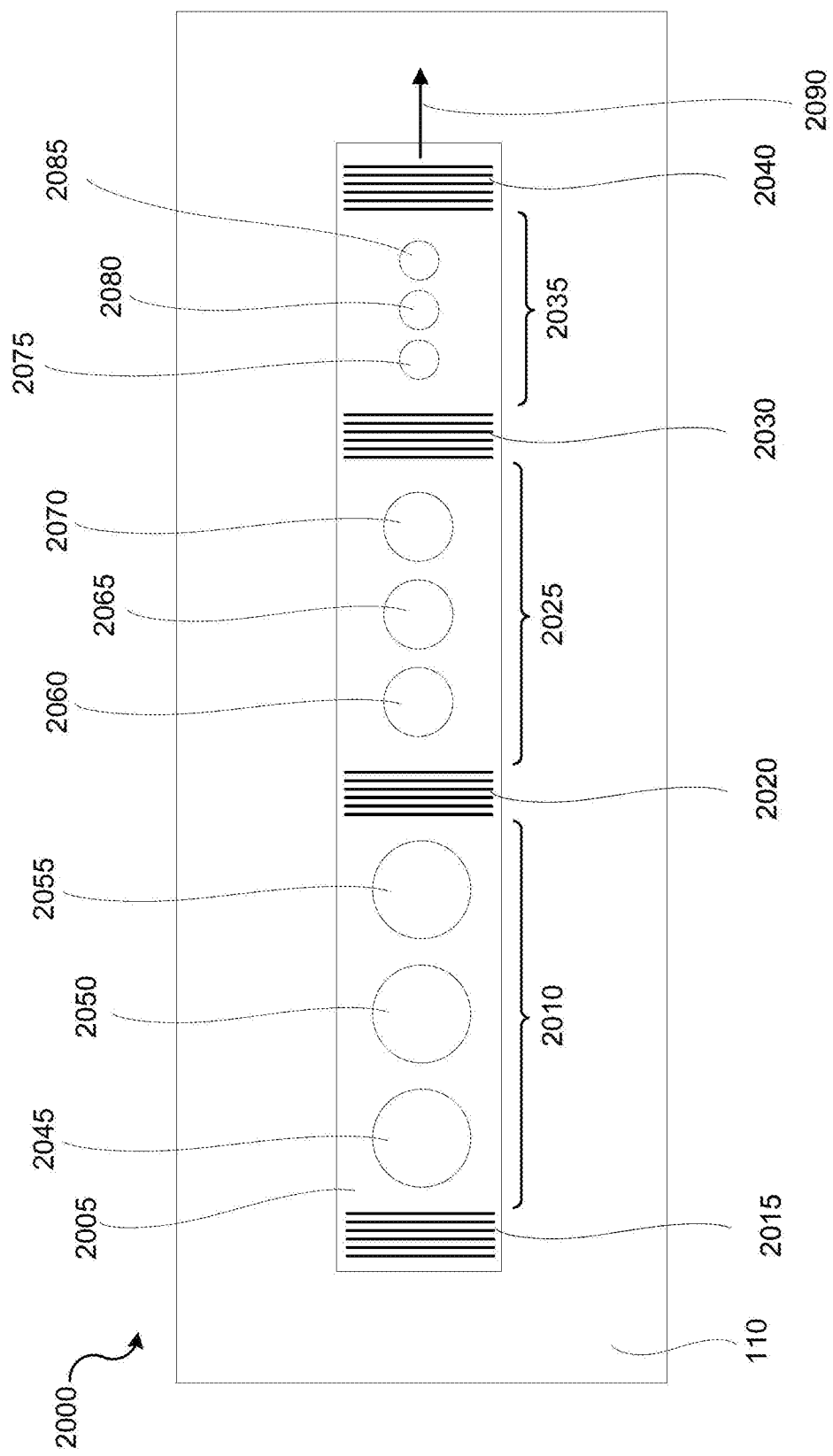
FIG. 20 shows a schematic top plan view of yet another example device to generate an output light, in accordance with a non-limiting implementation of the present specification.

To use the devices described herein in image projection applications, in some examples a device may be used to generate output light of a given color, and then output light of three different colors from three separate devices may be combined together to form a light beam that may be used for image projection. In other examples, one device comprising a waveguide may be used to generate an output light comprising three different colors. FIG. 20 shows a top perspective view of an example of such a device.

FIG. 20 shows device 2000 comprising a waveguide 2005 disposed on substrate 110. Waveguide 2005 comprises a first segment 2010 disposed between a first reflector 2015 and a second reflector 2020, a second segment 2025 disposed between second reflector 2020 and a third reflector 2030, and a third segment 2035 disposed between third reflector 2030 and a fourth reflector 2040.

Nanorods 2045, 2050, and 2055 may emit a first input light having a first wavelength when electrically biased. Reflector 2015 may reflect the first input light having the first wavelength, and reflector 2020 may partially reflect the first input light back into first segment 2010 and partially transmit the first input light into segment 2025.

Moreover, nanorods 2060, 2065, and 2070 may emit a second input light having a second wavelength when electrically biased. Reflector 2020 may reflect the second input light having the second wavelength. Reflector 2030 may transmit the first input light having the first wavelength, and may partially reflect the second input light back into second segment 2025 and partially transmit the second input light into segment 2035.

Furthermore, nanorods 2075, 2080, and 2085 may emit a third input light having a third wavelength when electrically biased. Reflector 2030 may reflect the third input light having the third wavelength. Reflector 2040 in turn may transmit the first and second input lights having the first and second wavelengths respectively, and may partially reflect the third input light back into third segment 2035 and partially transmit the third input light. Device 2000 may in turn generate an output light 2090, which comprises a combination of the first, second, and third input lights transmitted by fourth reflector 2040. As such, output light 2090 may comprise three different wavelengths, namely the first, second and third wavelengths, and may allow output light 2090 to be used for image projection.

In some examples, one or more of reflectors 2015, 2020, 2030, and 2040 may comprise a Bragg reflector, which may be disposed inside waveguide 2005. It is contemplated that in some examples different types of reflectors may be used between the segments of waveguide 2005.

In addition, in some examples different numbers, shapes, sizes, compositions, or distributions of QWSs may be used in addition to or in place of one or more of nanorods 2045, 2050, 2055, 2060, 2065, 2070, 2075, 2080, and 2085. For example, core-shell-shell nanorods, nanowalls or nanowall segments may be used in addition to or in place of one or more of the nanorods shown in FIG. 20. Moreover, in some examples one or more of the QWSs in FIG. 2 may be disposed partially inside waveguide 2005, or may be outside and in abutting, side-on contact with waveguide 2005.

Moreover, in FIG. 20 the longitudinal dimension of segments 2010, 2025, and 2035 are shown as being decreasing. It is contemplated that in some examples the longitudinal dimension of the segments need not be decreasing, and may be constant, increasing, or otherwise. Furthermore, in FIG. 20 the diameter of the footprint of the nanorods in segment 2010 is shown to be larger than the diameter of the nanorods in segment 2025, which are in turn shown as being larger than the diameter of the nanorods in segment 2035. For nanorods, changing the dimension of the footprint of the nanorods on the substrate may be one way of tuning the wavelength emitted by the nanorods. In other examples, other properties of the nanorods may be used to tune the wavelength. Examples of such properties include material composition, nature and extent of doping, structure (e.g. the extent of quantum confinement of the light emitting layer in the axial dimension of the nanorod), and the like.

In describing device 2000, the segments of the waveguide furthest from the optical outlet of waveguide 2005 from which output light 2090 is emitted may be described as being the furthest upstream. As the segments get closer to the optical outlet of waveguide 2005 the segments may be described as being progressively further downstream. As can be seen in FIG. 20, in order to exit device 2000, the light emitted by segment 2010 propagates downstream and passes the nanorods in segments 2025 and 2035. Similarly, the light emitted by segment 2025 also propagates downstream and passes the nanorods in segment 2035. The wavelength of the light emitted by each segment may be selected to reduce absorption by the QWSs in the subsequent, downstream segments.

For example, the QWSs optically coupled to segment 2010 of waveguide 2005 may be selected to emit the longest wavelength, with the QWSs optically coupled to segment 2025 emitting a relatively shorter wavelength, and the QWSs optically coupled to segment 2035 emitting the shortest wavelength. In this manner, the light generated in the upstream segments in the waveguide would generally not have sufficient energy to excite the electrons across the bandgap of the light-emitting materials of the QWSs in the segments further downstream, and as such the upstream light may be less likely to be absorbed by the light emitting materials of the QWSs of the downstream segments.

In addition, in some examples at least some of the non-light-emitting portions of QWSs disposed in a given segment of the waveguide may be biased to be transparent to the input light originating from an upstream segment of the waveguide and passing through the given segment on its way to the optical outlet of the waveguide.

The description herein shows and describes nanorods, nanowalls, and nanowall segments as examples of QWSs. It is contemplated that other types or shapes of QWSs may also be used in the devices describe herein, so long as the QWSs comprise a quantum-confined quantity of material which can emit light when electrically biased, and which light has an optical field that extends outside of the QWS to allow the QWS to be optically coupled with the waveguide. Moreover, in some examples QWSs may have external or internal geometries, including the size, proportions, and orientation of the light emitting layer, that may be different than those described herein in relation to FIGS. 1-20. Furthermore, it is contemplated that in some examples the QWSs may comprise more that one light emitting layer or region per QWS.

In addition, the devices described herein in relation to FIGS. 1-20 comprise a substrate on which the waveguide and QWSs are disposed. It is contemplated that in some examples the substrate may be selectively removed after the waveguide and the QWS are formed and connected to one another. Moreover, in some examples the devices need not comprise a substrate. In such examples the QWSs and the waveguide may be formed separately and then connected and optically coupled to one another, or one of the QWSs and the waveguide may act as the substrate on which the other is formed.

Various techniques may be used to fabricate the QWSs and the waveguides described herein. Lithography may be used to define where the QWS or the waveguides are positioned on the substrate. For example, a mask may be applied to the surface of the substrate, and the mask may be selectively removed in lithographically-defined areas where the QWSs or the waveguides may be deposited or formed.

In examples where the footprints of the QWSs are disposed partially for fully inside the footprint of the waveguide, the QWSs may be formed first, and then material of the waveguide may be deposited around or in-between the QWSs. For example, the material of the waveguide may be deposited as a flowable material which then forms a solid material. This, for example, may be the case when using deposition techniques such as spin-coating the waveguide material, and the like.

Throughout this specification and the appended claims, infinitive verb forms are often used. Examples include, without limitation: "to generate," "to emit," "to transmit," "to contain," and the like. Unless the specific context requires otherwise, such infinitive verb forms are used in an open, inclusive sense, that is as "to, at least, generate," to, at least, emit," "to, at least, transmit," and so on.

The above description of illustrated example implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. Moreover, the various example implementations described herein may be combined to provide further implementations.

In general, in the following claims, the terms used herein should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A device to generate coherent output light, the device comprising: a substrate; a quantum well structure (QWS) disposed directly on the substrate, the QWS having a first layer, a second layer, and a third layer, the second layer disposed and quantum-confined between the first layer and the third layer, the second layer to emit an input light when electrically biased, the input light having an optical field extending outside the QWS, and wherein the QWS is a nanorod or a nanowall with a lateral dimension not exceeding 5 um; and a waveguide disposed directly on the substrate and in contact with the QWS such that at least a portion of the QWS is adjacent to the waveguide, the optical field extending into the waveguide to optically couple the waveguide with the QWS, the waveguide to provide an optical resonance cavity for the input light to create coherent light, the waveguide having an optical outlet to transmit at least some of the coherent light out of the waveguide to generate the output light.

2. The device of claim 1, wherein:
   the substrate comprises a first side and a second side opposite the first side;
   the QWS and the waveguide are directly disposed on the first side and extend from the first side in a first direction away from the second side;
   the waveguide disposed directly on the first side is in contact with the QWS disposed directly on the first side in a second direction perpendicular to the first direction; and
   the at least a portion of the QWS is adjacent to the waveguide in the second direction.

3. The device of claim 2, wherein the QWS is partially disposed in the waveguide.

4. The device of claim 2, wherein a footprint of the QWS on the substrate is positioned in a corresponding footprint of the waveguide on the substrate.

5. The device of claim 4, wherein the waveguide is dimensioned to contain the optical field.

6. The device of claim 2, wherein:
the QWS comprises a nanorod having an axial dimension along the first direction; and
the nanorod contacts the waveguide in the second direction being radial to the axial dimension of the nanorod.

7. The device of claim 6, wherein the first layer, the second layer, and the third layer are stacked along the axial dimension.

8. The device of claim 6, wherein the nanorod comprises a core, an inner shell, and an outer shell oriented along the axial dimension, the core comprising the first layer, the inner shell comprising the second layer, and the outer shell comprising the third layer.

9. The device of claim 6, further comprising:
one or more additional QWSs disposed on the substrate and in contact with the waveguide, each of the additional QWSs having a corresponding first layer, a corresponding second layer, and a corresponding third layer, the corresponding second layer disposed and quantum-confined between the corresponding first layer and the corresponding third layer, the corresponding second layer to emit a corresponding input light when electrically biased, the corresponding input light having a corresponding optical field extending outside the respective additional QWS.

10. The device of claim 9, wherein:
each of the additional QWSs comprises a corresponding nanorod having a corresponding axial dimension along about the first direction; and
each of the corresponding nanorods contacts the waveguide in a corresponding second direction being radial to the corresponding axial dimension of the corresponding nanorod.

11. The device of claim 2, wherein the QWS comprises a nanowall with a lateral dimension not exceeding 5 um and having a height dimension along the first direction.

12. The device of claim 11, wherein the first layer, the second layer, and the third layer are stacked along the height dimension.

13. The device of claim 11, wherein: the nanowall has an elongated footprint on the substrate, the elongated footprint having a longitudinal dimension and the lateral dimension lateral to the longitudinal dimension; the waveguide comprises an elongated member having a corresponding longitudinal dimension; and the longitudinal dimension of the nanowall is oriented about parallel to the longitudinal dimension of the waveguide.

14. The device of claim 1, wherein the waveguide comprises a core to transmit the input light and a cladding to cover at least a portion of the core, the cladding disposed between the QWS and the core.

15. The device of claim 1, further comprising a reflective layer disposed on the substrate between the substrate and the waveguide.

16. The device of claim 1, further comprising an anti-reflective layer disposed on the QWS between the QWS and the waveguide.

17. The device of claim 1, wherein the waveguide is about ring-shaped.

18. The device of claim 1, wherein:
the QWS is in contact with a first segment of the waveguide disposed between a first reflector and a second reflector, and the input light has a first wavelength; and
the first reflector is to reflect the first wavelength and the second reflector is to partially reflect and partially transmit the first wavelength;
the device further comprising:
a second QWS disposed on the substrate and in contact with a second segment of the waveguide disposed between the second reflector and a third reflector, the second QWS to emit a corresponding input light having a second wavelength; and
the second reflector is to reflect the second wavelength and the third reflector is to transmit the first wavelength and partially reflect and partially transmit the second wavelength; and
a third QWS disposed on the substrate and in contact with a third segment of the waveguide disposed between the third reflector and a fourth reflector, the third QWS to emit a corresponding input light having a third wavelength; and
the third reflector is to transmit the first wavelength and the second wavelength and to reflect the third wavelength and the fourth reflector is to transmit the first wavelength and the second wavelength and to partially reflect and partially transmit the third wavelength.

19. The device of claim 18, wherein one or more of the first reflector, the second reflector, the third reflector, and the fourth reflector comprise a Bragg reflector disposed in the waveguide.

* * * * *